(12) United States Patent
Kawamura et al.

(10) Patent No.: US 7,307,019 B2
(45) Date of Patent: Dec. 11, 2007

(54) METHOD FOR SUPERCRITICAL CARBON DIOXIDE PROCESSING OF FLUORO-CARBON FILMS

(75) Inventors: Kohei Kawamura, Yamanashi (JP); Akira Asano, Yamanashi (JP); Koutarou Miyatani, Yamanashi (JP); Joseph T. Hillman, Scottsdale, AZ (US); Bentley Palmer, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 63 days.

(21) Appl. No.: 10/711,649

(22) Filed: Sep. 29, 2004

(65) Prior Publication Data

US 2006/0068583 A1    Mar. 30, 2006

(51) Int. Cl.
*H01L 21/302* (2006.01)

(52) U.S. Cl. .................................. 438/689

(58) Field of Classification Search .......... 438/623, 438/609
See application file for complete search history.

(56) References Cited

U.S. PATENT DOCUMENTS

| 2,439,689 A | 4/1948 | Hyde | 117/124 |
|---|---|---|---|
| 2,617,719 A | 11/1952 | Stewart | 23/312 |
| 2,625,886 A | 1/1953 | Browne | 103/150 |
| 3,744,660 A | 7/1973 | Gaines et al. | 220/10 |
| 3,890,176 A | 6/1975 | Bolon | 156/2 |
| 3,900,551 A | 8/1975 | Bardoncelli et al. | 423/9 |
| 3,968,885 A | 7/1976 | Hassan et al. | 214/1 BC |
| 4,029,517 A | 6/1977 | Rand | 134/11 |
| 4,091,643 A | 5/1978 | Zucchini | 68/18 C |
| 4,219,333 A | 8/1980 | Harris | 8/137 |
| 4,245,154 A | 1/1981 | Uehara et al. | 250/227 |
| 4,341,592 A | 7/1982 | Shortes et al. | 156/643 |
| 4,349,415 A | 9/1982 | DeFilippi et al. | 204/14 |
| 4,355,937 A | 10/1982 | Mack et al. | 414/217 |
| 4,367,140 A | 1/1983 | Wilson | 210/110 |

(Continued)

FOREIGN PATENT DOCUMENTS

CH        SE 251213        8/1948

(Continued)

OTHER PUBLICATIONS

T. Fukuda et al., "A Novel Method of Removing Impurities from Multilevel Interconnect Materials" (XP001232125), Japanese Journal of Applied Physics, Mar. 2004, pp. 936-939, vol. 43, No. 3, Japan Society of Applied Physics, Tokyo, Japan.

(Continued)

*Primary Examiner*—Carl Whitehead, Jr.
*Assistant Examiner*—Monica D. Harrison
(74) *Attorney, Agent, or Firm*—Wood, Herron & Evans, LLP

(57) ABSTRACT

A method for treating a fluoro-carbon dielectric film for integration of the dielectric film into a semiconductor device. The method includes providing a substrate having a fluoro-carbon film deposited thereon, the film having an exposed surface containing contaminants, and treating the exposed surface with a supercritical carbon dioxide fluid to clean the exposed surface of the contaminants and provide surface termination. The supercritical carbon dioxide treatment improves adhesion and electrical properties of film structures containing a metal-containing film formed on the surface of the fluoro-carbon dielectric film.

23 Claims, 7 Drawing Sheets

U.S. PATENT DOCUMENTS

| | | | | |
|---|---|---|---|---|
| 4,406,596 A | 9/1983 | Budde | | 417/393 |
| 4,422,651 A | 12/1983 | Platts | | 277/206 R |
| 4,474,199 A | 10/1984 | Blaudszun | | 134/105 |
| 4,475,993 A | 10/1984 | Blander et al. | | 204/64 |
| 4,522,788 A | 6/1985 | Sitek et al. | | 422/78 |
| 4,549,467 A | 10/1985 | Wilden et al. | | 91/307 |
| 4,592,306 A | 6/1986 | Gallego | | 118/719 |
| 4,601,181 A | 7/1986 | Privat | | 68/18 C |
| 4,626,509 A | 12/1986 | Lyman | | 435/287 |
| 4,670,126 A | 6/1987 | Messer et al. | | 204/298 |
| 4,682,937 A | 7/1987 | Credle, Jr. | | 417/393 |
| 4,693,777 A | 9/1987 | Hazano et al. | | 156/345 |
| 4,749,440 A | 6/1988 | Blackwood et al. | | 156/646 |
| 4,778,356 A | 10/1988 | Hicks | | 417/397 |
| 4,788,043 A | 11/1988 | Kagiyama et al. | | 422/292 |
| 4,789,077 A | 12/1988 | Noe | | 220/319 |
| 4,823,976 A | 4/1989 | White, III et al. | | 220/211 |
| 4,825,808 A | 5/1989 | Takahashi et al. | | 118/719 |
| 4,827,867 A | 5/1989 | Takei et al. | | 118/64 |
| 4,838,476 A | 6/1989 | Rahn | | 228/180.1 |
| 4,865,061 A | 9/1989 | Fowler et al. | | 134/108 |
| 4,877,530 A | 10/1989 | Moses | | 210/511 |
| 4,879,004 A | 11/1989 | Oesch et al. | | 203/89 |
| 4,879,431 A | 11/1989 | Bertoncini | | 435/311 |
| 4,917,556 A | 4/1990 | Stark et al. | | 414/217 |
| 4,923,828 A | 5/1990 | Gluck et al. | | 437/225 |
| 4,924,892 A | 5/1990 | Kiba et al. | | 134/123 |
| 4,925,790 A | 5/1990 | Blanch et al. | | 435/52 |
| 4,933,404 A | 6/1990 | Beckman et al. | | 526/207 |
| 4,944,837 A | 7/1990 | Nishikawa et al. | | 156/646 |
| 4,951,601 A | 8/1990 | Maydan et al. | | 118/719 |
| 4,960,140 A | 10/1990 | Ishijima et al. | | 134/31 |
| 4,983,223 A | 1/1991 | Gessner | | 134/25.4 |
| 5,011,542 A | 4/1991 | Weil | | 134/38 |
| 5,013,366 A | 5/1991 | Jackson et al. | | 134/1 |
| 5,044,871 A | 9/1991 | Davis et al. | | 414/786 |
| 5,062,770 A | 11/1991 | Story et al. | | 417/46 |
| 5,068,040 A | 11/1991 | Jackson | | 210/748 |
| 5,071,485 A | 12/1991 | Matthews et al. | | 134/2 |
| 5,105,556 A | 4/1992 | Kurokawa et al. | | 34/12 |
| 5,143,103 A | 9/1992 | Basso et al. | | 134/98.1 |
| 5,158,704 A | 10/1992 | Fulton et al. | | 252/309 |
| 5,167,716 A | 12/1992 | Boitnott et al. | | 118/719 |
| 5,169,296 A | 12/1992 | Wilden | | 417/395 |
| 5,169,408 A | 12/1992 | Biggerstaff et al. | | 29/25.01 |
| 5,174,917 A | 12/1992 | Monzyk | | 252/60 |
| 5,185,058 A | 2/1993 | Cathey, Jr. | | 156/656 |
| 5,185,296 A | 2/1993 | Morita et al. | | 437/229 |
| 5,186,594 A | 2/1993 | Toshima et al. | | 414/217 |
| 5,186,718 A | 2/1993 | Tepman et al. | | 29/25.01 |
| 5,188,515 A | 2/1993 | Horn | | 417/63 |
| 5,190,373 A | 3/1993 | Dickson et al. | | 366/146 |
| 5,191,993 A | 3/1993 | Wanger et al. | | 220/333 |
| 5,193,560 A | 3/1993 | Tanaka et al. | | 134/56 R |
| 5,195,878 A | 3/1993 | Sahiavo et al. | | 417/393 |
| 5,196,134 A | 3/1993 | Jackson | | 252/103 |
| 5,201,960 A | 4/1993 | Starov | | 134/11 |
| 5,213,485 A | 5/1993 | Wilden | | 417/393 |
| 5,213,619 A | 5/1993 | Jackson et al. | | 134/1 |
| 5,215,592 A | 6/1993 | Jackson | | 134/1 |
| 5,217,043 A | 6/1993 | Novakovi | | 137/460 |
| 5,221,019 A | 6/1993 | Pechacek et al. | | 220/315 |
| 5,222,876 A | 6/1993 | Budde | | 417/393 |
| 5,224,504 A | 7/1993 | Thompson et al. | | 134/155 |
| 5,225,173 A | 7/1993 | Wai | | 423/2 |
| 5,236,602 A | 8/1993 | Jackson | | 210/748 |
| 5,236,669 A | 8/1993 | Simmons et al. | | 422/113 |
| 5,237,824 A | 8/1993 | Pawliszyn | | 62/51.1 |
| 5,238,671 A | 8/1993 | Matson et al. | | 423/397 |
| 5,240,390 A | 8/1993 | Kvinge et al. | | 417/393 |
| 5,243,821 A | 9/1993 | Schuck et al. | | 62/50.6 |
| 5,246,500 A | 9/1993 | Samata et al. | | 118/719 |
| 5,250,078 A | 10/1993 | Saus et al. | | 8/475 |
| 5,251,776 A | 10/1993 | Morgan, Jr. et al. | | 220/360 |
| 5,261,965 A | 11/1993 | Moslehi | | 134/1 |
| 5,266,205 A | 11/1993 | Fulton et al. | | 210/639 |
| 5,267,455 A | 12/1993 | Dewees et al. | | 68/5 C |
| 5,269,815 A | 12/1993 | Schlenker et al. | | 8/475 |
| 5,269,850 A | 12/1993 | Jackson | | 134/2 |
| 5,274,129 A | 12/1993 | Natale et al. | | 549/349 |
| 5,280,693 A | 1/1994 | Heudecker | | 53/306 |
| 5,285,352 A | 2/1994 | Pastore et al. | | 361/707 |
| 5,288,333 A | 2/1994 | Tanaka et al. | | 134/31 |
| 5,290,361 A | 3/1994 | Hayashida et al. | | 134/2 |
| 5,294,261 A | 3/1994 | McDermott et al. | | 134/7 |
| 5,298,032 A | 3/1994 | Schlenker et al. | | 8/475 |
| 5,304,515 A | 4/1994 | Morita et al. | | 437/231 |
| 5,306,350 A | 4/1994 | Hoy et al. | | 134/22.14 |
| 5,312,882 A | 5/1994 | DeSimone et al. | | 526/201 |
| 5,313,965 A | 5/1994 | Palen | | 134/61 |
| 5,314,574 A | 5/1994 | Takahashi | | 156/646 |
| 5,316,591 A | 5/1994 | Chao et al. | | 134/34 |
| 5,320,742 A | 6/1994 | Fletcher et al. | | 208/89 |
| 5,328,722 A | 7/1994 | Ghanayem et al. | | 427/250 |
| 5,334,332 A | 8/1994 | Lee | | 252/548 |
| 5,334,493 A | 8/1994 | Fujita et al. | | 430/463 |
| 5,337,446 A | 8/1994 | Smith et al. | | 15/21.1 |
| 5,339,844 A | 8/1994 | Stanford, Jr. et al. | | 134/107 |
| 5,352,327 A | 10/1994 | Witowski | | 156/646 |
| 5,355,901 A | 10/1994 | Mielnik et al. | | 134/105 |
| 5,356,538 A | 10/1994 | Wai et al. | | 210/634 |
| 5,364,497 A | 11/1994 | Chau et al. | | 156/645 |
| 5,368,171 A | 11/1994 | Jackson | | 134/147 |
| 5,370,740 A | 12/1994 | Chao et al. | | 134/1 |
| 5,370,741 A | 12/1994 | Bergman | | 134/3 |
| 5,370,742 A | 12/1994 | Mitchell et al. | | 134/10 |
| 5,377,705 A | 1/1995 | Smith, Jr. et al. | | 134/95.3 |
| 5,401,322 A | 3/1995 | Marshall | | 134/13 |
| 5,403,621 A | 4/1995 | Jackson et al. | | 427/255.1 |
| 5,403,665 A | 4/1995 | Alley et al. | | 428/447 |
| 5,404,894 A | 4/1995 | Shiraiwa | | 134/66 |
| 5,412,958 A | 5/1995 | Iliff et al. | | 68/5 C |
| 5,417,768 A | 5/1995 | Smith, Jr. et al. | | 134/10 |
| 5,433,334 A | 7/1995 | Reneau | | 220/319 |
| 5,447,294 A | 9/1995 | Sakata et al. | | 266/257 |
| 5,456,759 A | 10/1995 | Stanford, Jr. et al. | | 134/1 |
| 5,470,393 A | 11/1995 | Fukazawa | | 134/3 |
| 5,474,812 A | 12/1995 | Truckenmuller et al. | | 427/430.1 |
| 5,482,564 A | 1/1996 | Douglas et al. | | 134/18 |
| 5,486,212 A | 1/1996 | Mitchell et al. | | 8/142 |
| 5,494,526 A | 2/1996 | Paranjpe | | 134/1 |
| 5,500,081 A | 3/1996 | Bergman | | 156/646.1 |
| 5,501,761 A | 3/1996 | Evans et al. | | 156/344 |
| 5,503,176 A | 4/1996 | Dummire et al. | | 137/15 |
| 5,505,219 A | 4/1996 | Lansberry et al. | | 134/105 |
| 5,509,431 A | 4/1996 | Smith, Jr. et al. | | 134/95.1 |
| 5,514,220 A | 5/1996 | Wetmore et al. | | 134/22.18 |
| 5,522,938 A | 6/1996 | O'Brien | | 134/1 |
| 5,526,834 A | 6/1996 | Mielnik et al. | | 134/105 |
| 5,533,538 A | 7/1996 | Marshall | | 134/104.4 |
| 5,547,774 A | 8/1996 | Gimzewski et al. | | 428/694 |
| 5,550,211 A | 8/1996 | DeCrosta et al. | | 528/489 |
| 5,571,330 A | 11/1996 | Kyogoku | | 118/719 |
| 5,580,846 A | 12/1996 | Hayashida et al. | | 510/175 |
| 5,589,082 A | 12/1996 | Lin et al. | | 216/2 |
| 5,589,105 A | 12/1996 | DeSimone et al. | | 252/351 |
| 5,589,224 A | 12/1996 | Tepman et al. | | 427/248.1 |
| 5,618,751 A | 4/1997 | Golden et al. | | 438/392 |
| 5,621,982 A | 4/1997 | Yamashita et al. | | 34/203 |
| 5,629,918 A | 5/1997 | Ho et al. | | 369/112 |
| 5,632,847 A | 5/1997 | Ohno et al. | | 156/344 |
| 5,635,463 A | 6/1997 | Muraoka | | 510/175 |
| 5,637,151 A | 6/1997 | Schulz | | 134/2 |

| Patent No. | Date | Inventor | Class |
|---|---|---|---|
| 5,641,887 A | 6/1997 | Beckman et al. | 546/26.2 |
| 5,644,855 A | 7/1997 | McDermott et al. | 34/516 |
| 5,649,809 A | 7/1997 | Stapelfeldt | 417/63 |
| 5,656,097 A | 8/1997 | Olesen et al. | 134/1 |
| 5,665,527 A | 9/1997 | Allen et al. | 430/325 |
| 5,669,251 A | 9/1997 | Townsend et al. | 68/58 |
| 5,672,204 A | 9/1997 | Habuka | 117/204 |
| 5,676,705 A | 10/1997 | Jureller et al. | 8/142 |
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,702,228 A | 12/1997 | Tamai et al. | 414/744.5 |
| 5,706,319 A | 1/1998 | Holtz | 376/203 |
| 5,714,299 A | 2/1998 | Combes et al. | 430/137 |
| 5,725,987 A | 3/1998 | Combes et al. | 430/137 |
| 5,726,211 A | 3/1998 | Hedrick et al. | 521/61 |
| 5,730,874 A | 3/1998 | Wai et al. | 210/638 |
| 5,736,425 A | 4/1998 | Smith et al. | 438/778 |
| 5,739,223 A | 4/1998 | DeSimone | 526/89 |
| 5,746,008 A | 5/1998 | Yamashita et al. | 34/211 |
| 5,766,367 A | 6/1998 | Smith et al. | 134/2 |
| 5,769,588 A | 6/1998 | Toshima et al. | 414/217 |
| 5,783,082 A | 7/1998 | DeSimone et al. | 210/634 |
| 5,797,719 A | 8/1998 | James et al. | 417/46 |
| 5,798,126 A | 8/1998 | Fujikawa et al. | 425/78 |
| 5,798,438 A | 8/1998 | Sawan et al. | 528/483 |
| 5,804,607 A | 9/1998 | Hedrick et al. | 521/64 |
| 5,807,607 A | 9/1998 | Smith et al. | 427/96 |
| 5,817,178 A | 10/1998 | Mita et al. | 118/666 |
| 5,847,443 A | 12/1998 | Cho et al. | 257/632 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,061 A | 2/1999 | Lee et al. | 438/705 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,882,165 A | 3/1999 | Maydan et al. | 414/217 |
| 5,888,050 A | 3/1999 | Fitzgerald et al. | 417/46 |
| 5,893,756 A | 4/1999 | Berman et al. | 438/692 |
| 5,896,870 A | 4/1999 | Huynh et al. | 134/1.3 |
| 5,898,727 A | 4/1999 | Fujikawa et al. | 373/110 |
| 5,900,107 A | 5/1999 | Murphy et al. | 156/359 |
| 5,900,354 A | 5/1999 | Batchelder | 430/395 |
| 5,904,737 A | 5/1999 | Preston et al. | 8/158 |
| 5,906,866 A | 5/1999 | Webb | 427/534 |
| 5,908,510 A | 6/1999 | McCullough et al. | 134/2 |
| 5,928,389 A | 7/1999 | Jevtic | 29/25.01 |
| 5,932,100 A | 8/1999 | Yager et al. | 210/634 |
| 5,934,856 A | 8/1999 | Asakawa et al. | 414/217 |
| 5,934,991 A | 8/1999 | Rush | 454/187 |
| 5,944,996 A | 8/1999 | DeSimone et al. | 210/634 |
| 5,955,140 A | 9/1999 | Smith et al. | 427/96 |
| 5,965,025 A | 10/1999 | Wai et al. | 210/634 |
| 5,975,492 A | 11/1999 | Brenes | 251/175 |
| 5,976,264 A | 11/1999 | McCullough et al. | 134/2 |
| 5,979,306 A | 11/1999 | Fujikawa et al. | 100/90 |
| 5,980,648 A | 11/1999 | Adler | 134/34 |
| 5,981,399 A | 11/1999 | Kawamura et al. | 438/715 |
| 5,989,342 A | 11/1999 | Ikede et al. | 118/52 |
| 5,992,680 A | 11/1999 | Smith | 220/812 |
| 5,994,696 A | 11/1999 | Tai et al. | 250/288 |
| 6,005,226 A | 12/1999 | Aschner et al. | 219/390 |
| 6,017,820 A | 1/2000 | Ting et al. | 438/689 |
| 6,021,791 A | 2/2000 | Dryer et al. | 134/100.1 |
| 6,024,801 A | 2/2000 | Wallace et al. | 134/1 |
| 6,029,371 A | 2/2000 | Kamikawa et al. | 34/516 |
| 6,035,871 A | 3/2000 | Eui-Yeol | 134/61 |
| 6,037,277 A | 3/2000 | Masakara et al. | 438/787 |
| 6,053,348 A | 4/2000 | Morch | 220/263 |
| 6,056,008 A | 5/2000 | Adams et al. | 137/487.5 |
| 6,063,714 A | 5/2000 | Smith et al. | 438/778 |
| 6,067,728 A | 5/2000 | Farmer et al. | 34/470 |
| 6,077,053 A | 6/2000 | Fujikawa et al. | 417/399 |
| 6,077,321 A | 6/2000 | Adachi et al. | 29/25.01 |
| 6,082,150 A | 7/2000 | Stucker | 68/18 R |
| 6,085,935 A | 7/2000 | Malchow et al. | 220/813 |
| 6,097,015 A | 8/2000 | McCullough et al. | 219/686 |
| 6,099,619 A | 8/2000 | Lansbarkis et al. | 95/118 |
| 6,100,198 A | 8/2000 | Grieger et al. | 438/692 |
| 6,110,232 A | 8/2000 | Chen et al. | 29/25.01 |
| 6,114,044 A | 9/2000 | Houston et al. | 428/447 |
| 6,122,566 A | 9/2000 | Nguyen et al. | 700/218 |
| 6,128,830 A | 10/2000 | Bettcher et al. | 34/404 |
| 6,140,252 A | 10/2000 | Cho et al. | 438/781 |
| 6,145,519 A | 11/2000 | Konishi et al. | 134/95.2 |
| 6,149,828 A | 11/2000 | Vaartstra | 216/57 |
| 6,159,295 A | 12/2000 | Maskara et al. | 118/688 |
| 6,164,297 A | 12/2000 | Kamikawa | 134/61 |
| 6,171,645 B1 | 1/2001 | Smith et al. | 427/96 |
| 6,186,722 B1 | 2/2001 | Shirai | 414/217 |
| 6,200,943 B1 | 3/2001 | Romack et al. | 510/285 |
| 6,203,582 B1 | 3/2001 | Berner et al. | 29/25.01 |
| 6,216,364 B1 | 4/2001 | Tanaka et al. | 34/448 |
| 6,224,774 B1 | 5/2001 | DeSimone et al. | 210/634 |
| 6,228,563 B1 | 5/2001 | Starov et al. | 430/327 |
| 6,228,826 B1 | 5/2001 | DeYoung et al. | 510/291 |
| 6,232,238 B1 | 5/2001 | Chang et al. | 438/725 |
| 6,232,417 B1 | 5/2001 | Rhodes et al. | 526/171 |
| 6,235,634 B1 | 5/2001 | White et al. | 438/680 |
| 6,239,038 B1 | 5/2001 | Wen | 438/745 |
| 6,241,825 B1 | 6/2001 | Wytman | 118/733 |
| 6,242,165 B1 | 6/2001 | Vaartstra | 430/329 |
| 6,244,121 B1 | 6/2001 | Hunter | 73/865.9 |
| 6,251,250 B1 | 6/2001 | Keigler | 205/89 |
| 6,255,732 B1 | 7/2001 | Yokoyama et al. | 257/760 |
| 6,270,531 B1 | 8/2001 | DeYoung et al. | 8/142 |
| 6,270,948 B1 | 8/2001 | Sato et al. | 430/314 |
| 6,277,753 B1 | 8/2001 | Mullee et al. | 438/692 |
| 6,284,558 B1 | 9/2001 | Sakamoto | 438/30 |
| 6,286,231 B1 | 9/2001 | Bergman et al. | 34/410 |
| 6,305,677 B1 | 10/2001 | Lenz | 269/13 |
| 6,306,564 B1 | 10/2001 | Mullee | 430/329 |
| 6,319,858 B1 | 11/2001 | Lee et al. | 438/787 |
| 6,331,487 B2 | 12/2001 | Koch | 438/692 |
| 6,334,266 B1 | 1/2002 | Moritz et al. | 34/337 |
| 6,344,174 B1 | 2/2002 | Miller et al. | 422/98 |
| 6,344,243 B1 | 2/2002 | McClain et al. | 427/388.1 |
| 6,355,072 B1 | 3/2002 | Racette et al. | 8/142 |
| 6,358,673 B1 | 3/2002 | Namatsu | 430/311 |
| 6,361,696 B1 | 3/2002 | Spiegelman et al. | 210/662 |
| 6,367,491 B1 | 4/2002 | Marshall et al. | 134/104.4 |
| 6,380,105 B1 | 4/2002 | Smith et al. | 438/778 |
| 6,388,317 B1 | 5/2002 | Reese | 257/713 |
| 6,389,677 B1 | 5/2002 | Lenz | 29/559 |
| 6,418,956 B1 | 7/2002 | Bloom | 137/14 |
| 6,425,956 B1 | 7/2002 | Cotte et al. | 134/3 |
| 6,436,824 B1 | 8/2002 | Chooi et al. | 438/687 |
| 6,451,510 B1 | 9/2002 | Messick et al. | 430/311 |
| 6,454,519 B1 | 9/2002 | Toshima et al. | 414/805 |
| 6,454,945 B1 | 9/2002 | Weigl et al. | 210/634 |
| 6,458,494 B2 | 10/2002 | Song et al. | 430/5 |
| 6,461,967 B2 | 10/2002 | Wu et al. | 438/705 |
| 6,464,790 B1 | 10/2002 | Sherstinsky et al. | 118/715 |
| 6,472,334 B2 | 10/2002 | Ikakura et al. | 438/778 |
| 6,478,035 B1 | 11/2002 | Niuya et al. | |
| 6,479,407 B2 | 11/2002 | Yokoyama et al. | 438/788 |
| 6,485,895 B1 | 11/2002 | Choi et al. | 430/330 |
| 6,486,078 B1 | 11/2002 | Rangarajan et al. | 438/778 |
| 6,487,792 B2 | 12/2002 | Sutton et al. | |
| 6,487,994 B2 | 12/2002 | Ahern et al. | |
| 6,492,090 B2 | 12/2002 | Nishi et al. | 430/270.1 |
| 6,500,605 B1 | 12/2002 | Mullee et al. | 430/329 |

| | | | |
|---|---|---|---|
| 6,508,259 B1 | 1/2003 | Tseronis et al. ............ 134/105 |
| 6,509,136 B1 | 1/2003 | Goldfarb et al. ......... 430/272.1 |
| 6,520,767 B1 | 2/2003 | Ahern et al. |
| 6,521,466 B1 | 2/2003 | Castrucci ...................... 438/5 |
| 6,537,916 B2 | 3/2003 | Mullee et al. .............. 438/692 |
| 6,541,278 B2 | 4/2003 | Morita et al. ................... 438/3 |
| 6,546,946 B2 | 4/2003 | Dunmire ................. 137/15.18 |
| 6,550,484 B1 | 4/2003 | Gopinath et al. ............ 134/1.2 |
| 6,554,507 B2 | 4/2003 | Namatsu ..................... 396/611 |
| 6,558,475 B1 | 5/2003 | Jur et al. ....................... 134/21 |
| 6,561,213 B2 | 5/2003 | Wang et al. ................. 137/263 |
| 6,561,220 B2 | 5/2003 | McCullough et al. .. 137/565.12 |
| 6,561,481 B1 | 5/2003 | Filonczuk .............. 251/129.12 |
| 6,561,767 B2 | 5/2003 | Berger et al. ................. 417/53 |
| 6,561,774 B2 | 5/2003 | Layman |
| 6,562,146 B1 | 5/2003 | DeYoung et al. ............. 134/30 |
| 6,564,826 B2 | 5/2003 | Shen ..................... 137/505.18 |
| 6,576,138 B2 | 6/2003 | Sateria et al. ............... 210/664 |
| 6,583,067 B2 | 6/2003 | Chang et al. ............... 438/723 |
| 6,596,093 B2 | 7/2003 | DeYoung et al. ............. 134/36 |
| 6,623,355 B2 | 9/2003 | McClain et al. .............. 457/60 |
| 6,635,582 B2 | 10/2003 | Yun et al. .................... 438/745 |
| 6,641,678 B2 | 11/2003 | DeYoung et al. ............. 134/36 |
| 6,656,666 B2 | 12/2003 | Simons et al. ............... 430/322 |
| 6,669,916 B2 | 12/2003 | Heim et al. .............. 423/245.1 |
| 6,673,521 B2 | 1/2004 | Moreau et al. ............. 430/315 |
| 6,677,244 B2 | 1/2004 | Ono et al. ................... 438/706 |
| 6,685,903 B2 | 2/2004 | Wong et al. ................ 423/262 |
| 6,722,642 B1 | 4/2004 | Sutton et al. |
| 6,736,149 B2 | 5/2004 | Biberger et al. |
| 6,737,725 B2 | 5/2004 | Grill et al. ................... 257/522 |
| 6,748,960 B1 | 6/2004 | Biberger et al. |
| 6,764,552 B1 | 7/2004 | Joyce et al. ..................... 134/3 |
| 6,777,312 B2 | 8/2004 | Yang et al. .................. 438/464 |
| 6,780,765 B2 | 8/2004 | Goldstein .................... 438/660 |
| 6,852,194 B2 | 2/2005 | Matsushita et al. |
| 6,871,656 B2 | 3/2005 | Mullee |
| 6,890,853 B2 | 5/2005 | Biberger et al. |
| 6,921,456 B2 | 7/2005 | Biberger et al. |
| 6,924,086 B1 | 8/2005 | Arena-Foster et al. |
| 6,926,012 B2 | 8/2005 | Biberger et al. |
| 6,926,798 B2 | 8/2005 | Biberger et al. ....... 156/345.31 |
| 6,928,746 B2 | 8/2005 | Arena-Foster et al. |
| 6,953,654 B2 | 10/2005 | Ryza et al. |
| 6,958,123 B2 * | 10/2005 | Reid et al. ..................... 216/2 |
| 2001/0024247 A1 | 9/2001 | Nakata ......................... 349/43 |
| 2002/0001929 A1 | 1/2002 | Biberger et al. ............ 438/584 |
| 2002/0112746 A1 | 8/2002 | DeYoung et al. ............. 134/36 |
| 2002/0117391 A1 | 8/2002 | Beam .......................... 203/81 |
| 2002/0142595 A1 | 10/2002 | Chiou ......................... 438/689 |
| 2002/0164873 A1 | 11/2002 | Masuda et al. .............. 438/689 |
| 2003/0003762 A1 | 1/2003 | Cotte et al. .................. 438/745 |
| 2003/0013311 A1 | 1/2003 | Chang et al. ................ 438/704 |
| 2003/0047533 A1 | 3/2003 | Reid et al. .................... 216/24 |
| 2003/0106573 A1 | 6/2003 | Masuda et al. ............... 134/26 |
| 2003/0125225 A1 | 7/2003 | Xu et al. ..................... 510/175 |
| 2003/0196679 A1 | 10/2003 | Cotte et al. ..................... 134/1 |
| 2003/0198895 A1 | 10/2003 | Toma et al. |
| 2003/0202792 A1 | 10/2003 | Goshi |
| 2003/0205510 A1 | 11/2003 | Jackson ........................ 210/86 |
| 2003/0217764 A1 | 11/2003 | Masuda et al. ............... 134/26 |
| 2004/0011386 A1 | 1/2004 | Seghal |
| 2004/0020518 A1 | 2/2004 | DeYoung et al. ............. 134/30 |
| 2004/0045588 A1 | 3/2004 | DeYoung et al. ............. 134/26 |
| 2004/0087457 A1 | 5/2004 | Korzenski et al. .......... 510/177 |
| 2004/0099952 A1 | 5/2004 | Goodner et al. |
| 2004/0103922 A1 | 6/2004 | Inoue et al. ................... 134/26 |
| 2004/0112409 A1 | 6/2004 | Schilling ...................... 134/26 |
| 2004/0175958 A1 | 9/2004 | Lin et al. |
| 2004/0177867 A1 | 9/2004 | Schilling ...................... 134/26 |
| 2004/0259357 A1 | 12/2004 | Saga |
| 2004/0261710 A1 | 12/2004 | Matsushita et al. |
| 2005/0077597 A1 | 4/2005 | Toma et al. |
| 2005/0095840 A1 * | 5/2005 | Bhanap et al. .............. 438/623 |
| 2005/0158477 A1 | 7/2005 | Vezin et al. |
| 2005/0176230 A1 * | 8/2005 | Sieber et al. ................ 438/609 |
| 2005/0203789 A1 | 9/2005 | Kauffman et al. |
| 2005/0215072 A1 | 9/2005 | Kevwitch et al. |
| 2005/0216228 A1 | 9/2005 | Kauffman et al. |
| 2006/0003592 A1 | 1/2006 | Gale et al. |

FOREIGN PATENT DOCUMENTS

| | | |
|---|---|---|
| CN | 1399790 A | 2/2003 |
| DE | 36 08 783 A1 | 9/1987 |
| DE | 39 04 514 C2 | 3/1990 |
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| DE | 198 60 084 A1 | 7/2000 |
| EP | 0 244 951 A2 | 11/1987 |
| EP | 02 72 141 A2 | 6/1988 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 453 867 A1 | 10/1991 |
| EP | 0 518 653 B1 | 12/1992 |
| EP | 0 536 752 A2 | 4/1993 |
| EP | 0 572 913 A1 | 12/1993 |
| EP | 0 587 168 A1 | 3/1994 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |
| EP | 0 829 312 A2 | 3/1998 |
| EP | 0 836 895 A2 | 4/1998 |
| EP | 0 903 775 A2 | 3/1999 |
| FR | 1 499 491 | 9/1967 |
| GB | 2 003 975 | 3/1979 |
| GB | 2 193 482 | 2/1988 |
| JP | 60-192333 | 9/1985 |
| JP | 60-2348479 | 11/1985 |
| JP | 60-246635 | 12/1985 |
| JP | 61-017151 | 1/1986 |
| JP | 61-231166 | 10/1986 |
| JP | 62-111442 | 5/1987 |
| JP | 62-125619 | 6/1987 |
| JP | 63-256326 | 10/1988 |
| JP | 63-303059 | 12/1988 |
| JP | 1-045131 | 2/1989 |
| JP | 1-246835 | 10/1989 |
| JP | 2-148841 | 6/1990 |
| JP | 2-209729 | 8/1990 |
| JP | 2-304941 | 12/1990 |
| JP | 4-284648 | 10/1992 |
| JP | 7-142333 | 6/1995 |
| JP | 8-186140 A | 7/1996 |
| JP | 8-222508 A | 8/1996 |
| JP | 10-144757 A | 5/1998 |
| JP | 56-142629 | 11/1998 |
| JP | 10335408 A | 12/1998 |
| JP | 11-200035 | 7/1999 |
| JP | 2000-106358 | 4/2000 |
| WO | WO 87/07309 | 12/1987 |
| WO | WO 90/06189 | 6/1990 |
| WO | WO 90/13675 | 11/1990 |
| WO | WO 91/12629 A | 8/1991 |
| WO | WO 93/14255 | 7/1993 |
| WO | WO 93/14259 | 7/1993 |
| WO | WO 93/20116 | 10/1993 |

| | | |
|---|---|---|
| WO | WO 96/277704 | 9/1996 |
| WO | WO 99/18603 A | 4/1999 |
| WO | WO 99/49998 | 10/1999 |
| WO | WO 00/36635 | 6/2000 |
| WO | WO 00/73241 A1 | 12/2000 |
| WO | WO 01/10733 A1 | 2/2001 |
| WO | WO 01/33613 A2 | 5/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A2 | 12/2001 |
| WO | WO 02/09894 A2 | 2/2002 |
| WO | WO 02/11191 A2 | 2/2002 |
| WO | WO 02/15251 A1 | 2/2002 |
| WO | WO 02/16051 A2 | 2/2002 |
| WO | WO03064065 A1 | 8/2003 |
| WO | WO03077032 A1 | 9/2003 |
| WO | WO 03/030219 A2 | 10/2003 |

OTHER PUBLICATIONS

I. Kato et al., "New Method of Improve Electrical Characteristics of Low-k Dielectrics in Cu-Damascene Interconnections" (XP008060635), 2003 Advanced Metallization Conference, pp. 699-704, Materials Research Society, Warrendale, PA.

J. A. Lubguban et al., "Supercritical Carbon Dioxide Extraction to Produce Low-k plasma Enhanced Chemical Vapor Deposited Dielectric Films" (XP012032705), Applied Physics Letter, Dec. 2, 2002, pp. 4407-4409, vol. 81, No. 23, American Institute of Physics, Melville, NY.

European Patent Office, International Search Report and Written Opinion, Mar. 3, 2006, 9 pgs.

Z. Guan et al., *Fluorocarbon-Based Heterophase Polymeric Materials. I. Block Copolymer Surfactants for Carbon Dioxide Applications*, Macromolecules, vol. 27, pp. 5527-5532, 1994.

*International Journal of Environmentally Conscious Design & Manufacturing*, vol. 2, No. 1, pp. 83, 1993.

Matson and Smith, *Supercritical Fluids*, Journal of the American Ceramic Society, vol. 72, No. 6, pp. 872-874, 1989.

Kawakami et al., *A Super Low-k(k=1,1)Silica Aerogel Film Using Supercritical Drying Technique*, IEEE, pp. 143-145, 2000.

R. F. Reidy, *Effects of Supercritical Processing on Ultra Low-k Films*, Texas Advanced Technology Program, Texas Instruments and the Texas Academy of Mathematics and Science, 2002.

Anthony Muscat, *Backend Processing Using Supercritical $CO_2$*, University of Arizona, 2003.

Jones et al., *HF Etchant Solutions in Supercritical Carbon Dioxide for "Dry" Etch Processing of Microelectronic Devices*, Chem Mater., vol. 15, 2003, pp. 2867-2869.

Gangopadhyay et al., *Supercritical $CO_2$ Treatments for Semiconductor Applications*, Mat. Res. Soc. Symp. Proc., vol. 812, 2004, pp. F4.6.1-F4.6.6.

European Patent Office, *International Search Report*, PCT/US2005/013885, Oct. 24, 2005, 4 pp.

J. B. Rubin et al., *A Comparison of Chilled DI Water/Ozone and $CO_2$-based Supercritical Fluids as Replacements for Photoresist-Stripping Solvents*, IEEE/CPMT Int'l Electronics Manufacturing Technology Symposium, pp. 308-314, 1998.

*Los Alamos National Laboratory*, Solid State Technology, pp. S10 & S14, Oct. 1998.

*Supercritical Carbon Dioxide Resist Remover, SCORR, the Path to Least Photoresistance*, Los Alamos National Laboratory, 1998.

Matson and Smith, *Supercritical Fluids*, Journal of the American Ceramic Society, vol. 72, No. 6, pp. 872-874.

D. H. Ziger et al., *Compressed Fluid Technology: Application to RIE Developed Resists*, AIChE Journal, vol. 33, No. 10, pp. 1585-1591, Oct. 1987.

Kirk-Othmer, *Alcohol Fuels to Toxicology*, Encyclopedia of Chemical Terminology, 3rd ed., Supplement Volume, New York: John Wiley & Sons, pp. 872-893, 1984.

*Cleaning with Supercritical $CO_2$*, NASA Tech Briefs, MFS-29611, Marshall Space Flight Center, Alabama, Mar. 1979.

N. Basta, *Supercritical Fluids: Still Seeking Acceptance*, Chemical Engineering vol. 92, No. 3, pp. 14, Feb. 24, 1985.

D. Takahashi, *Los Alamos Lab Finds Way to Cut Chip Toxic Waste*, Wall Street Journal, Jun. 22, 1998.

*Supercritical $CO_2$ Process Offers Less Mess from Semiconductor Plants*, Chemical Engineering Magazine, pp. 27 & 29, Jul. 1988.

Y. P. Sun, *Preparation of Polymer Protected Semiconductor Nanoparticles Through the Rapid Expansion of Supercritical Fluid Solution*, Chemical Physics Letters, pp. 585-588, May 22, 1998.

K. Jackson et al., *Surfactants and Micromulsions in Supercritical Fluids*, Supercritical Fluid Cleaning, Noyes Publications, Westwood, NJ, pp. 87-120, Spring 1998.

M. Kryszcwski, *Production of Metal and Semiconductor Nanoparticles in Polymer Systems*, Polimery, pp. 65-73, Feb. 1998.

G. L. Bakker et al., *Surface Cleaning and Carbonaceous Film Removal Using High Pressure, High Temperature Water, and Water/$CO_2$ Mixtures*, J Electrochem Soc., vol. 145, No. 1, pp. 284-291, Jan. 1998.

C. K. Ober et al., *Imaging Polymers with Supercritical Carbon Dioxide*, Advanced Materials, vol. 9, No. 13, pp. 1039-1043, Nov. 3, 1997.

E. M. Russick et al., *Supercritical Carbon Dioxide Extraction of Solvent from Micro-Machined Structures*, Supercritical Fluids Extraction and Pollution Prevention, ACS Symposium Series, vol. 670, pp. 255-269, Oct. 21, 1997.

N. Dahmen et al., *Supercritical Fluid Extraction of Grinding and Metal Cutting Waste Contaminated with Oils*, Supercritical Fluids—Extraction and Pollution Prevention, ACS Symposium Series, vol. 670, pp. 270-279, Oct. 21, 1997.

C. M. Wal, *Supercritical Fluid Extraction: Metals as Complexes*, Journal of Chromatography A, vol. 785, pp. 369-383, Oct. 17, 1997.

C. Xu et al., *Submicron-Sized Spherical Yttrium Oxide Based Phosphors Prepared by Supercritical $CO_2$-Assisted Nerosolization and Pyrolysis*, Appl. Phys. Lett., vol. 71, No. 22, pp. 1643-1645, Sep. 22, 1997.

Y. Tomioka et al., *Decomposition of Tetramethylammonium (TMA) in a Positive Photo-resist Developer by Supercritical Water*, Abstracts of Papers 214th ACS Natl Meeting, American Chemical Society, Abstract No. 108, Sep. 7, 1997.

H. Klein et al., *Cyclic Organic Carbonates Serve as Solvents and Reactive Diluents*, Coatings World, pp. 38-40, May 1997.

J. Bühler et al., *Linear Array of Complementary Metal Oxide Semiconductor Double-Pass Metal Micro-mirrors*, Opt. Eng. vol. 36, No. 5, pp. 1391-1398, May 1997.

M. H. Jo et al., *Evaluation of $SiO_2$ Aerogel Thin Film with Ultra Low Dielectric Constant as an Intermetal Dielectric*, Micrelectronic Engineering, vol. 33, pp. 343-348, Jan. 1997.

J. B. McClain et al., *Design of Nonionic Surfactants for Supercritical Carbon Dioxide*, Science, vol. 274, pp. 2049-2052, Dec. 20, 1996.

L. Znaidi et al., *Batch and Semi-Continuous Synthesis of Magnesium Oxide Powders from Hydrolysis and Supercritical Treatment of $Mg(OCH_3)_2$*, Materials Research Bulletin, vol. 31, No. 12, pp. 1527-1535, Dec. 1996.

M. E. Tadros, *Synthesis of Titanium Dioxide Particles in Supercritical $CO_2$*, J. Supercritical Fluids, vol. 9, pp. 172-176, Sep. 1996.

V. G. Courtecuisse et al., *Kinetics of the Titanium Isopropoxide Decomposition in Supercritical Isopropyl Alcohol*, Ind. Eng. Chem. Res., vol. 35, No. 8, pp. 2539-2545, Aug. 1996.

A. Gabor et al., *Block and Random Copolymer Resists Designed for 193 nm Lithography and Environmentally Friendly Supercritical $CO_2$Development*, SPIE, vol. 2724, pp. 410-417, Jun. 1996.

G. L. Schimek et al., *Supercritical Ammonia Synthesis and Characterization of Four New Alkali Metal Silver Antimony Sulfides . . .*, J. Solid State Chemistry, vol. 123, pp. 277-284, May 1996.

P. Gallagher-Wetmore et al., *Supercritical Fluid Processing: Opportunities for New Resist Materials and Processes*, SPIE, vol. 2725, pp. 289-299, Apr. 1996.

K. I. Papathomas et al., *Debonding of Photoresists by Organic Solvents*, J. Applied Polymer Science, vol. 59, pp. 2029-2037, Mar. 28, 1996.

J. J. Watkins et al., *Polymer/Metal Nanocomposite Synthesis in Supercritical $CO_2$*, Chemistry of Materials, vol. 7, No. 11, pp. 1991-1994, Nov. 1995.

E. F. Gloyna et al., *Supercritical Water Oxidation Research and Development Update*, Environmental Progress, vol. 14, No. 3, pp. 182-192, Aug. 1995.

P. Gallagher-Wetmore et al., *Supercritical Fluid Processing: A New Dry Technique for Photoresist Developing*, SPIE, vol. 2438, pp. 694-708, Jun. 1995.

A. H. Gabor et al., *Silicon-Containing Block Copolymer Resist Materials*, Microelectronics Technology—Polymers for Advanced Imaging and Packaging, ACS Symposium Series, vol. 615, pp. 281-298, Apr. 1995.

P. C. Tsiartas et al., *Effect of Molecular Weight Distribution on the Dissolution Properties of Novolac Blends*, SPIE, vol. 2438, pp. 264-271, Jun. 1995.

R. D. Allen et al., *Performance Properties of Near-Monodisperse Novolak Resins*, SPIE, vol. 2438, pp. 250-260, Jun. 1995.

P. T. Wood et al., *Synthesis of New Channeled Structures in Supercritical Amines . . .* , Inorg. Chem., vol. 33, pp. 1556-1558, 1994.

J. B. Jerome et al., *Synthesis of New Low-Dimensional Quaternary Compounds . . .* , Inorg. Chem., vol. 33, pp. 1733-1734, 1994.

J. McHardy et al., *Progress in Supercritical $CO_2$ Cleaning*, SAMPE Jour, vol. 29, No. 5, pp. 20-27, Sep. 1993.

R. Purtell et al., *Precision Parts Cleaning Using Supercritical Fluids*, J. Vac. Sci. Technol. A., vol. 11, No. 4, pp. 1696-1701, Jul. 1993.

E. Bok et al., *Supercritical Fluids for Single Wafer Cleaning*, Solid State Technology, pp. 117-120, Jun. 1992.

T. Adschiri et al., *Rapid and Continuous Hydrothermal Crystallization of Metal Oxide Particles in Supercritical Water*, J. Am. Ceram. Cos., vol. 75, No. 4, pp. 1019-1022, 1992.

B. N. Hansen et al., *Supercritical Fluid Transport—Chemical Deposition of Films*, Chem. Mater, vol. 4, No. 4, pp. 749-752, 1992.

S. H. Page et al., *Predictability and Effect of Phase Behavior of $CO_2$/Propylene Carbonate in Supercritical Fluid Chromatography*, J. Microcol, vol. 3, No. 4, pp. 355-369, 1991.

T. Brokamp et al., *Synthese und Kristallstruktur Eines Gemischtvalenten Lithium-Tantalnitride $Li_2Ta_3N_5$*, J. Alloys and Compounds, vol. 176, pp. 47-60, 1991.

B. M. Hybertson et al., *Deposition of Palladium Films by a Novel Supercritical Transport Chemical Deposition Process*, Mat. Res. Bull., vol. 26, pp. 1127-1133, 1991.

D. H. Ziger et al., *Compressed Fluid Technology: Application to RIE Developed Resists*, AlChE Journal, vol. 33, No. 10, pp. 1585-1591, Oct. 1987.

D. W. Matson et al., *Rapid Expansion of Supercritical Fluid Solutions: Solute Formation of Powders, Thin Films, and Fibers*, Ind. Eng. Chem. Res., vol. 26, No. 11, pp. 2298-2306, 1987.

W. K. Tolley et al., *Stripping Organics from Metal and Mineral Surfaces Using Supercritical Fluids*, Separation Science and Technology, vol. 22, pp. 1087-1101, 1987.

*Final Report on the Safety Assessment of Propylene Carbonate*, J. American College of Toxicology, vol. 6, No. 1, pp. 23-51, 1987.

*Porous Xerogel Films as Ultra-Low Permittivity Dielectrics for ULSI Interconnect Applications*, Materials Research Society, pp. 463-469, 1987.

R. F. Reidy, *Effects of Supercritical Processing on Ultra Low-k Films*, Texas Advanced Technology Program, Texas Instruments and the Texas Academy of Mathematics and Science.

Anthony Muscat, *Backend Processing Using Supercritical $CO_2$*, University of Arizona.

D. Goldfarb et al., *Aqueous-based Photoresist Drying Using Supercritical Carbon Dioxide to Prevent Pattern Collapse*, J. Vacuum Sci. Tech. B, vol. 18, No. 6, pp. 3313, 2000.

H. Namatsu et al., *Supercritical Drying for Water-Rinsed Resist Systems*, J. Vacuum Sci. Tech. B, vol. 18, No. 6, pp. 3308, 2000.

N. Sundararajan et al., *Supercritical $CO_2$ Processing for Submicron Imaging of Fluoropolymers*, Chem. Mater., vol. 12, 41, 2000.

Hideaki Itakura et al., *Multi-Chamber Dry Etching System*, Solid State Technology, pp. 209-214, Apr. 1982.

Joseph L. Foszez, *Diaphragm Pumps Eliminate Seal Problems*, Plant Engineering, pp. 1-5, Feb. 1, 1996.

Bob Agnew, *WILDEN Air-Operated Diaphragm Pumps*, Process & Industrial Training Technologies, Inc., 1996.

* cited by examiner

METHOD FOR SUPERCRITICAL CARBON DIOXIDE PROCESSING OF FLUORO-CARBON FILMS

FIELD OF THE INVENTION

The present invention relates to the field of processing dielectric films and, more particularly, to supercritical carbon dioxide processing of fluoro-carbon films for integration of the films into semiconductor devices.

BACKGROUND OF THE INVENTION

The drive to reduce the minimum feature sizes of microelectronic devices to meet the demand for faster, lower power microprocessors and digital circuits has introduced new materials and processes into device manufacturing. These new materials include low dielectric constant (low-k) materials and ultra-low-k (ULK) materials that can provide several advantages relative to the traditional silicon dioxide dielectric materials. For example, the use of low-k fluoro-carbon materials to separate conductive lines in semiconductor devices reduces the RC time constant by reducing the capacitance, which in turn, increases the speed of the device.

Fluoro-carbon films have attracted a great deal of interest not only as material for interlayer dielectrics in ultra-large scale integrated (ULSI) circuits, but also for electrical insulation in electrical equipment, because of their low dielectric constant, high-dielectric strength, and chemical inertness. Although low-k fluoro-carbon materials have a number of advantageous properties, they tend to be less chemically robust than more traditional oxide and nitride dielectric layers and they can suffer from problems that limit their use in typical semiconductor processes. These problems include outgassing (e.g., fluorine outdiffusion) and undesirable chemical reactions during processing, and poor adhesion to other materials in the semiconductor device.

SUMMARY OF THE INVENTION

The present invention provides a method for processing a fluoro-carbon dielectric film for integration of the dielectric film into a semiconductor device.

According to an embodiment of the invention, the method includes providing a substrate having a fluoro-carbon film deposited thereon, the film having an exposed surface containing contaminants, and treating the exposed surface with a supercritical carbon dioxide fluid to clean the exposed surface of the contaminants and provide surface termination.

According to another embodiment of the invention, the method includes providing a substrate having a patterned fluoro-carbon dielectric film formed thereon, the patterned fluoro-carbon dielectric film having one or more vias, trenches, or combinations thereof, and the patterned fluoro-carbon dielectric film having an exposed surface containing contaminants; and treating the exposed surface with a supercritical carbon dioxide fluid to clean the exposed surface of the contaminants and provide surface termination.

According to an embodiment of the invention, the supercritical carbon dioxide treatment improves adhesion and annealing properties of a metal-containing film formed on the surface of a treated fluoro-carbon dielectric film.

DETAILED DESCRIPTION OF SEVERAL EMBODIMENTS OF THE INVENTION

Figure 1A:
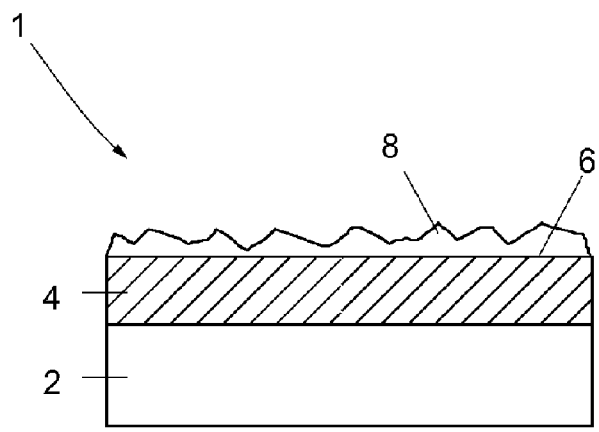
FIGS. 1A-1B show a cross-sectional view of a process of treating a film structure containing a fluoro-carbon dielectric film in accordance with an embodiment of the invention.
Figure 1B:
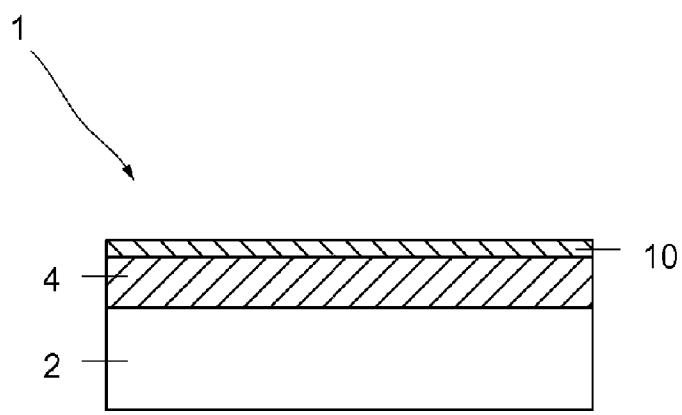

FIGS. 1A-1B show a cross-sectional view of a process for treating a film structure containing a fluoro-carbon dielectric film in accordance with an embodiment of the invention. The film structure 1 contains a substrate 2 and a fluoro-carbon dielectric film 4 deposited onto the substrate 2. The fluoro-carbon dielectric film 4 can, for example, be a dense film with low or no porosity. In one example, the fluoro-carbon dielectric film can have dielectric constant between about 2.2 and about 2.4. Low porosity of the fluoro-carbon dielectric film 4 can reduce or eliminate various problems, such as moisture uptake and poor mechanical strength, which are commonly encountered for porous low-k films. The fluoro-carbon dielectric film 4 can, for example, be deposited on the substrate 2 in a plasma processing system using a process gas containing a halocarbon gas (e.g., $C_5F_8$) or $SiH(CH_3)_3$.

In one example, the fluoro-carbon dielectric film 4 can be deposited using a radial line slot antenna (RLSA) plasma source for 2.45 GHz-microwave using a process gas containing a $C_5F_8$ gas flow rate of 250 standard cubic centimeters per second (sccm) and an Ar gas flow rate of 200 sccm at a process gas pressure of 45 mTorr in the plasma processing chamber. The plasma power can, for example, be about 2,300 W; the temperature of the substrate 2 can, for example, be about 350° C.; and the thickness of the fluoro-carbon film can, for example, be about 1500-3000 Å. As would be appreciated by those skilled in the art of plasma processing, other plasma sources and process gases can be used to deposit the fluoro-carbon dielectric film 4 onto the substrate 2.

In another example, nitrogen can be incorporated into the deposited fluoro-carbon dielectric film 4. The nitrogen-incorporation, for example, be performed by a RLSA plasma source using a process gas containing a $N_2$ gas at a gas flow rate of 50 sccm and a process gas pressure of 250 mTorr in the plasma processing chamber. The plasma power can, for example, be about 1,500 W; the temperature of the substrate 2 can, for example, be about 350° C.; and the processing time can be about 1 min.

The fluoro-carbon dielectric film 4 can contain contaminants 8 on the exposed surface 6. The contaminants 8 can, for example, originate from the process of depositing the fluoro-carbon dielectric film 4 onto the substrate 2 and/or from post-deposition exposure of the fluoro-carbon dielectric film 4 to contaminants. In one embodiment of the invention, the contaminants 8 can contain a thin layer (e.g., less than 100 angstroms (Å)) of hydrocarbon fragments (e.g., $CH_x$), water ($H_2O$), hydroxyl (OH), or hydrogen fluoride (HF), or a combination of two or more thereof. Fourier-transform infrared (FTIR) spectroscopy of as-deposited fluoro-carbon dielectric films from halocarbon gas showed the presence of C—H functional groups on the surface 6. The presence of the contaminants 8 on the surface 6 can lead to poor adhesion of metal-containing films and other films to the fluoro-carbon dielectric film 4, as well as other integration problems.

FIG. 1B shows the film structure 1 following supercritical carbon dioxide processing of the fluoro-carbon dielectric film 2 according to an embodiment of the present invention. The supercritical carbon dioxide processing is capable of cleaning at least a portion of the contaminant 8 from the surface 6 of the fluoro-carbon dielectric film 4, and can provide surface termination of the fluoro-carbon film 4 by forming a surface termination layer 10. In one embodiment of the invention, the supercritical carbon dioxide processing can use pure supercritical carbon dioxide fluid to form a surface termination layer 10 containing C—F functional groups. In another embodiment of the invention, the supercritical carbon dioxide fluid can include an alcohol. The alcohol can, for example, contain methanol, ethanol, propanol, or butanol, or a combination of two or more thereof.

In yet another embodiment of the invention, the supercritical carbon dioxide processing can use a supercritical carbon dioxide fluid containing a silicon-containing chemical to form a surface termination layer 10 containing Si—$CH_3$ functional groups. The silicon-containing chemical can be selected from a wide variety of compounds, for example, hexamethyldisilane, hexamethyldisilazane, dimethylsilyldiethylamine, tetramethyldisilazane, trimethylsilyldimethylamine, dimethylsilyldimethylamine, trimethylsilyldiethylamine, bis-trimethylsilyl-urea, bis(dimethylamino)methyl silane, bis(dimethylamino)dimethyl silane, dimethylaminopentamethyldisilane, dimethylaminodimethyldisilane. In still another embodiment of the invention, the supercritical carbon dioxide fluid can contain an alcohol and a silicon-containing chemical. As would be appreciated by those skilled in the art, other alcohols and silicon-containing chemicals may be employed without departing from the scope of the invention. For example, the silicon-containing chemicals can generally contain silanes, disilanes, silyl amines, silyl ureas, and silazanes.

FTIR spectroscopy of fluoro-carbon dielectric films treated according to embodiments of the invention showed removal of C—H functional groups from the surface 6. In addition, the supercritical carbon dioxide processing was found to preserve various material properties of the film 4, including the dielectric constant, the refractive index, the modulus, and the hardness, and the film thickness. Furthermore, the supercritical carbon dioxide processing was found to reduce leakage current density of the processed films by about one order of magnitude, compared to the as-deposited films.

Figure 1C:
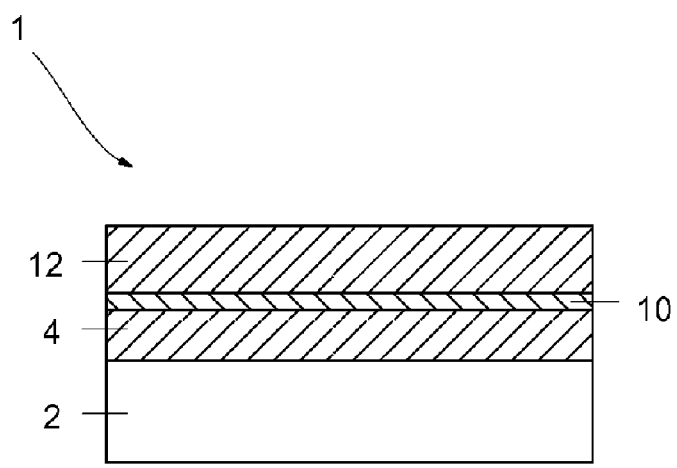
FIG. 1C shows a cross-sectional view of a film structure containing a metal-containing layer on a treated fluoro-carbon dielectric film in accordance with an embodiment of the invention.

FIG. 1C shows a cross-sectional view of a film structure containing a metal-containing layer on a treated fluoro-carbon dielectric film in accordance with an embodiment of the invention. In FIG. 1C, the film structure 1 contains a metal-containing film 12 deposited onto the surface termination layer 10. The metal-containing film 12 can, for example, be a tantalum-containing film. The tantalum-containing film can contain Ta, $TaN_x$, or a combination thereof. In one example, the tantalum-containing film can contain a layered Ta, $TaN_x$ structure. The metal-containing film can, for example, be a barrier layer, such as diffusion barrier layer for copper metallization.

Supercritical carbon dioxide processing of the fluoro-carbon dielectric film 4 according to embodiments of the invention was found to provide improved adhesion of the metal-containing film 12 to the fluoro-carbon film 4. Furthermore, the supercritical carbon dioxide processing resulted in improved electrical resistivity of the film structure 1 before and after annealing of the film structure 1 shown in FIG. 1C.

Figure 1D:
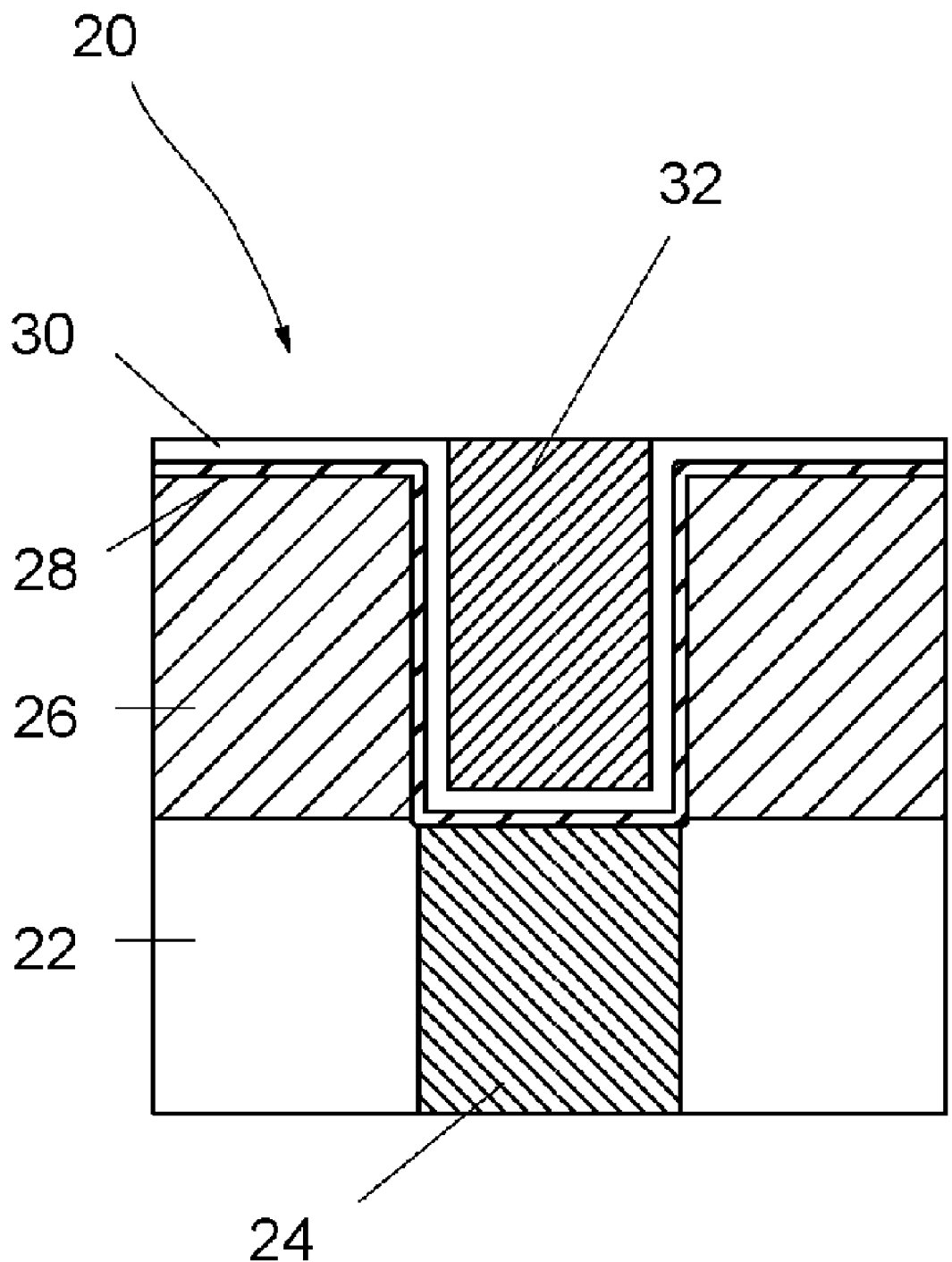
FIG. 1D shows a cross-sectional view of a patterned film structure containing a treated fluoro-carbon dielectric film in accordance with another embodiment of the invention.

FIG. 1D shows a cross-sectional view of a patterned film structure containing a treated fluoro-carbon dielectric film in accordance with another embodiment of the invention. The patterned film structure 20 contains examples of horizontal and vertical surfaces of a fluoro-carbon dielectric film encountered in semiconductor processing. The film structure 20 contains a substrate 22, a metal film 24, a fluoro-carbon dielectric film 26, a surface termination layer 28, a metal-containing barrier layer 30, and a metal film 32.

Figure 2:
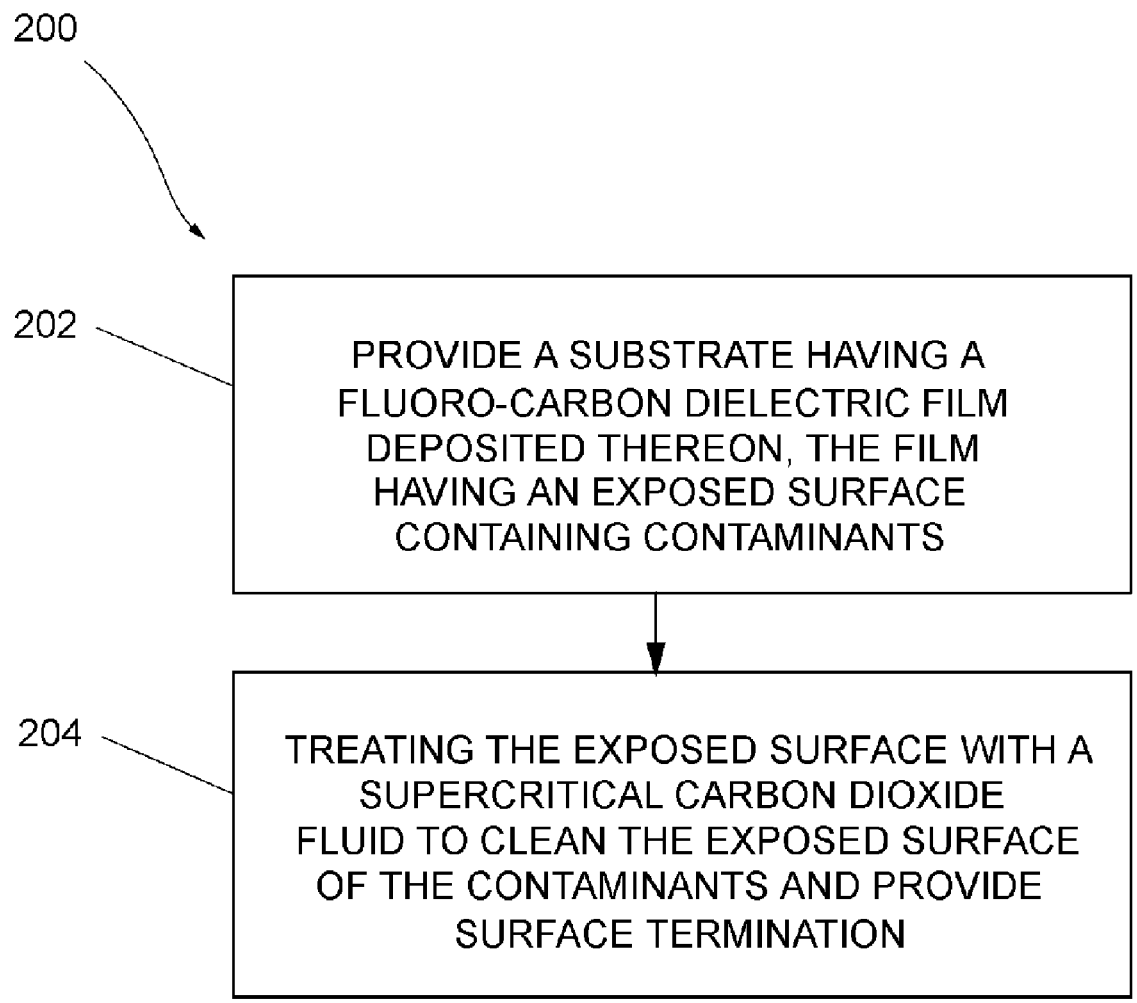
FIG. 2 is a flow diagram for supercritical carbon dioxide processing of a fluoro-carbon dielectric film according to an embodiment of the present invention.

FIG. 2 is a flow diagram for supercritical carbon dioxide processing of a fluoro-carbon dielectric film according to an embodiment of the present invention. Referring additionally to FIGS. 1A-1B, the process 200 includes, in step 202, providing in a supercritical processing system a substrate 2 having a fluoro-carbon dielectric film 4 deposited thereon. The film 4 has an exposed surface 6 containing contaminants 8. Next, in step 204, the process 200 includes treating the surface 6 with a supercritical carbon dioxide fluid to clean the surface 6 of the contaminants 8 and provide a surface termination layer 10. The process 200 can be used to process horizontal as well as vertical surfaces of fluoro-carbon dielectric films. Via and trench sidewalls are examples of vertical surfaces encountered in semiconductor processing, for example dual damascene processing.

It will be clear to one skilled in the art that each of the steps or stages in the flowchart of FIG. 2 may encompass one or more separate steps and/or operations. Accordingly, the recitation of only two steps in 202, 204 in the process 200, should not be understood to be limited solely to two steps or stages. Moreover, each representative step or stage 202, 204 should not be understood to be limited to only a single process.

Figure 3:
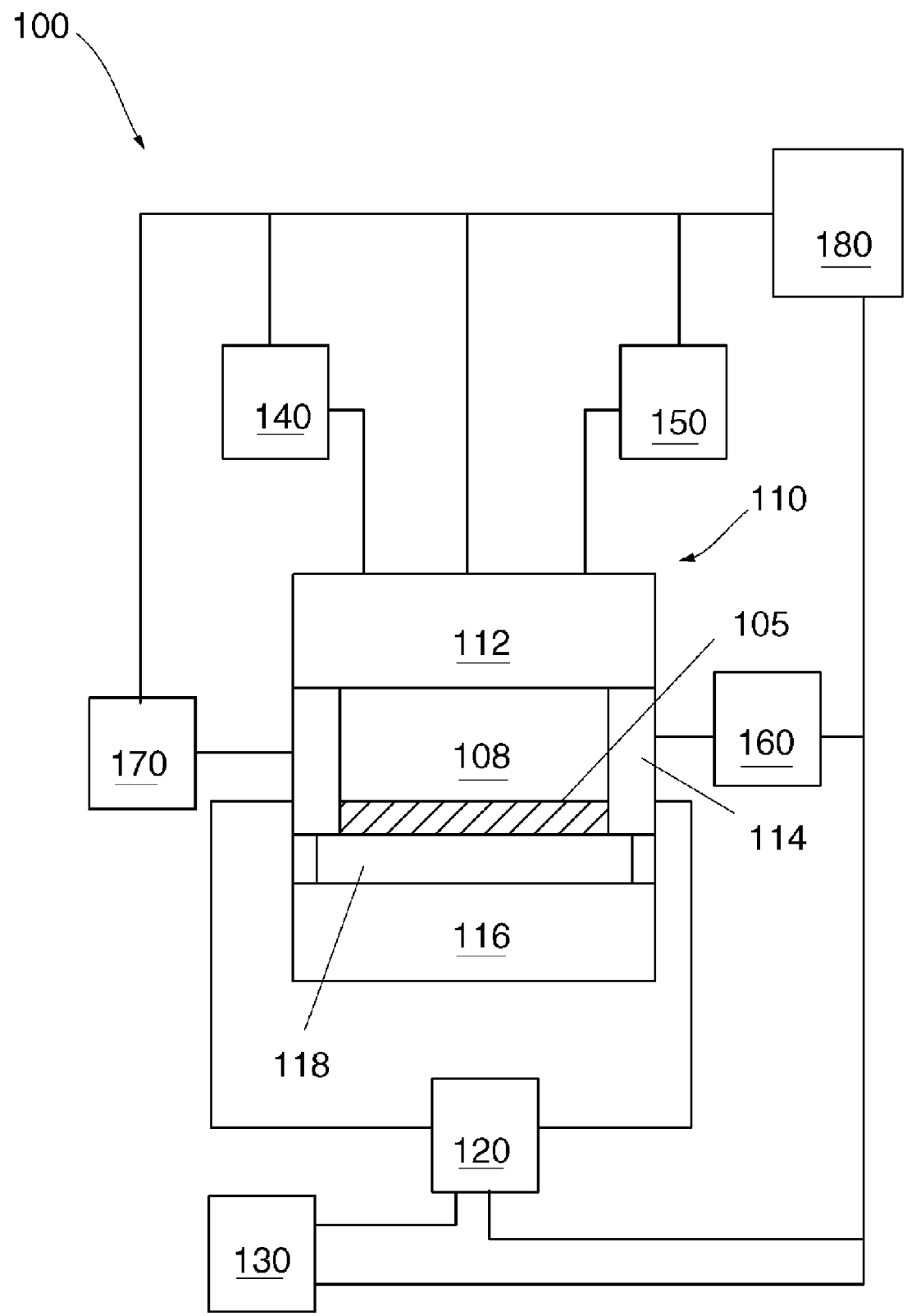
FIG. 3 shows a simplified schematic diagram of a supercritical carbon dioxide processing system in accordance with an embodiment of the invention.

FIG. 3 shows a simplified schematic diagram of a supercritical carbon dioxide processing system in accordance with an embodiment of the invention. The processing system 100 contains a substrate transfer system 170 configured to move a substrate 105 in and out of the process chamber 108 of a process module 110 through a slot (not shown). In one example, the slot can be opened and closed by moving the chuck 118, and in another example, the slot can be controlled using a gate valve (not shown). In FIG. 3, the processing system 100 further includes a circulation system 120, a chemical supply system 130, a carbon dioxide supply system 140, a pressure control system 150, an exhaust system 160, and a controller 180. The controller 180 can be coupled to the processing module 110, the circulation system 120, the chemical supply system 130, the carbon dioxide supply system 140, the pressure control system 150, the exhaust system 160, and the substrate transfer system 170. Alternately, the controller 180 can be coupled to a one or more additional controllers/computers (not shown), and the controller 180 can obtain setup and/or configuration information from an additional controller/computer.

In FIG. 3, singular processing elements (110, 120, 130, 140, 150, 160, 170, and 180) are shown, but this is not required for the invention. The processing system 100 can include any number of processing elements having any number of controllers associated with them in addition to independent processing elements. The controller 180 can be used to configure any number of processing elements (110, 120, 130, 140, 150, 160, and 170), and the controller 180 can collect, provide, process, store, and display data from the processing elements. The controller 180 can comprise a number of applications for controlling one or more of the processing elements. For example, controller 180 can include a GUI (graphic user interface) component (not shown) that can provide easy to use interfaces that enable a user to monitor and/or control one or more processing elements.

The processing module 110 can include an upper assembly 112, a frame 114, and a lower assembly 116. The upper assembly 112 can comprise a heater (not shown) for heating the process chamber 108, the substrate 105, or the supercritical carbon dioxide fluid, or a combination of two or more thereof. Alternately, a heater is not required. The frame 114 can include means for flowing a supercritical carbon dioxide fluid through the process chamber 108. In one example, a circular flow pattern can be established in the process chamber 108; and in another example, a substantially linear flow pattern can be established in the process chamber 108. Alternately, the means for flowing a processing fluid in the process chamber 108 can be configured differently. The lower assembly 116 can comprise one or more lifters (not shown) for moving the chuck 118 and/or the substrate 105. Alternately, a lifter is not required.

In one embodiment, the processing module 110 includes a holder or chuck 118 for supporting and holding the substrate 105 while processing the substrate 105. The stage or chuck 118 can also be configured to heat or cool the substrate 105 before, during, and/or after processing the substrate 105. Alternately, the processing module 110 can include a platen (not shown) for supporting and holding the substrate 105 while processing the substrate 105. The process chamber 108 can process a substrate 105 of any size, for example a 200 mm substrate, a 300 mm substrate, or an even larger substrate.

The circulation system 120 can comprise one or more valves for regulating the flow of a supercritical carbon dioxide fluid through the circulation system 120 and through the processing module 110. The circulation system 120 can comprise any number of back-flow valves, filters, pumps, and/or heaters (not shown) for maintaining and flowing a supercritical carbon dioxide fluid through the circulation system 120 and through the processing module 110. Carbon dioxide fluid is in a supercritical state when above the critical temperature $T_c$ of about 31° C. and the critical pressure $P_c$ of about 1,070 psig. Supercritical carbon dioxide fluid has virtually no viscosity or surface tension and has therefore no difficulty in penetrating all the way to the bottom of a micro-feature to remove a residue from the micro-feature. In one embodiment of the invention, the temperature of the supercritical carbon dioxide fluid in the process chamber 108 can be between about 35° C. and about 200° C. Alternately, the temperature of the carbon dioxide fluid in the process chamber 108 can be between about 40° C. and about 120° C.

The processing system 100 can contain a carbon dioxide supply system 140. As shown in FIG. 3, the carbon dioxide supply system 140 can be coupled to the processing module 110, but this is not required. In alternate embodiments, the carbon dioxide supply system 140 can be configured differently and coupled differently. For example, the carbon dioxide supply system 140 can be coupled to the circulation system 120.

The carbon dioxide supply system 140 can contain a carbon dioxide source (not shown) and a plurality of flow control elements (not shown) for controlling delivery of carbon dioxide fluid to the process chamber 108. For example, the carbon dioxide source can include a carbon dioxide feed system, and the flow control elements can include supply lines, valves, filters, pumps, and heaters. The carbon dioxide supply system 140 can comprise an inlet valve (not shown) that is configured to open and close to allow or prevent the stream of carbon dioxide from flowing into the process chamber 108. For example, controller 180 can be used to determine fluid parameters including pressure, temperature, process time, and flow rate.

In the illustrated embodiment in FIG. 3, the chemical supply system 130 is coupled to the circulation system 120, but this is not required for the invention. In alternate embodiments, the chemical supply system 130 can be configured differently and can be coupled to different elements in the processing system 100. The chemical supply system 130 can comprise a cleaning chemical assembly (not shown) for providing a cleaning chemical for generating a supercritical carbon dioxide fluid with a desired concentration of cleaning chemicals within the process chamber 108. The cleaning chemicals can, for example, include solvents such as alcohols and/or silicon-containing chemicals. By way of further example, the cleaning chemicals can include methanol, hexamethyidisilane, or both.

The chemical supply system 130 can furthermore provide a rinsing chemical for generating supercritical carbon dioxide rinsing fluid within the process chamber 108. The rinsing chemical can include one or more organic solvents including, but not limited to, alcohols, ketones, or both. In one embodiment of the invention, the organic solvent can contain methanol, ethanol, n-propanol, isopropanol, benzyl alcohol, acetone, butylene carbonate, propylene carbonate, dimethylsulfoxide, γ-butyrolactone, dimethyl formamide, dimethyl acetamide, or ethyl lactate, or a combination of two or more thereof. As would be appreciated by those skilled in the art, other organic solvents may be employed without departing from the scope of the invention.

The processing system 100 can also comprise a pressure control system 150. As shown in FIG. 3, the pressure control system 150 can be coupled to the processing module 110, but this is not required. In alternate embodiments, pressure control system 150 can be configured differently and coupled differently. The pressure control system 150 can include one or more pressure valves (not shown) for regulating the pressure within the process chamber 108. Alternately, the pressure control system 150 can also include one or more pumps (not shown). For example, one pump may be used to increase the pressure within the process chamber, and another pump may be used to evacuate the process chamber 108. In another embodiment, the pressure control system 150 can comprise means for sealing the process chamber. In addition, the pressure control system 150 can comprise means for raising and lowering the substrate 105 and/or the chuck 118.

Furthermore, the processing system 100 can comprise an exhaust system 160. As shown in FIG. 3, the exhaust system 160 can be coupled to the processing module 110, but this is not required. In alternate embodiments, exhaust system 160 can be configured differently and coupled differently. The exhaust system 160 can include an exhaust gas collection vessel (not shown) and can be used to remove contaminants from the processing fluid. Alternately, the exhaust system 160 can be used to recycle the processing fluid.

Controller 180 can be used to feed forward and/or feed back information. For example, feed-forward information can comprise pre-process data associated with an in-coming substrate. This pre-process data can include lot data, batch data, run data, type of substrate, and type of layers overlying the substrate, and history data including, for example, type of process gases used in depositing a fluoro-carbon dielectric film on the substrate. The pre-process data can be used to establish an input state for a substrate. The controller 180 can use the difference between an input data item for an incoming substrate (input state) and a desired data item (desired state) to predict, select, or calculate a set of process parameters to achieve the desired result of changing the state of the substrate from the input state to the desired state. The desired state can, for example, indicate the level of substrate cleanliness following a cleaning process and/or a rinse process. For example, this predicted set of process parameters can be a first estimate of a recipe to use based on an input state and a desired state. In one embodiment, data such as the input state and/or the desired state data can be obtained from a host.

In one example, the controller 180 knows the input state and a model equation for the desired state for the substrate, and the controller determines a set of recipes that can be performed on the substrate to change the status of the substrate from the input state to a desired state. For example, the set of recipes can describe a multi-step process involving a set of process systems. For example, post-process metrology data can be obtained to evaluate the state of the substrate, i.e., if the contaminant has been sufficiently removed from the fluoro-carbon dielectric film. Post-process metrology data can be obtained after a time delay that can vary from minutes to days. Post-process metrology data can be used as a part of the feedback control.

The controller 180 can compute a predicted state for the wafer based on the input state, the process characteristics, and a process model. For example, a cleaning rate model can be used along with a contaminant level to compute a predicted cleaning time. Alternately, a rinse rate model can be used along with a contaminant level to compute a processing time for a rinse process. The controller 180 can comprise a database component (not shown) for storing input and output data. Process models can include linear models, quadratic models, full quadratic models, and higher order polynomial models. A process model can provide the relationship between one or more process recipe parameters or setpoints and one or more process results and can include multiple variables.

In a supercritical cleaning/rinsing process, the desired process result can be a process result that is measurable using an optical measuring device. For example, the desired process result can be an amount of contaminant on a fluoro-carbon dielectric film. After each cleaning process run, an actual process result can be measured and compared to a desired process result to determine process compliance. After each cleaning process run, the actual process results can be determined, and a system of equations can be created to solve for the coefficients in the model equation.

In general, process control can include updating a process module recipe using metrology information measured on the substrate prior to its arrival in the process module 110. For a cleaning process, the incoming substrates should all be the same, with the same pre-processing data. The controller can use the pre-processing data to verify that all of the substrates used in a group are the same. The process of creating the process models requires an understanding of the mechanics of experimental design, execution of an appropriate experiment and analysis of the resultant experimental data. This process can be highly automated and integrated into the film removal system 70 using the technique described herein.

Figure 4:
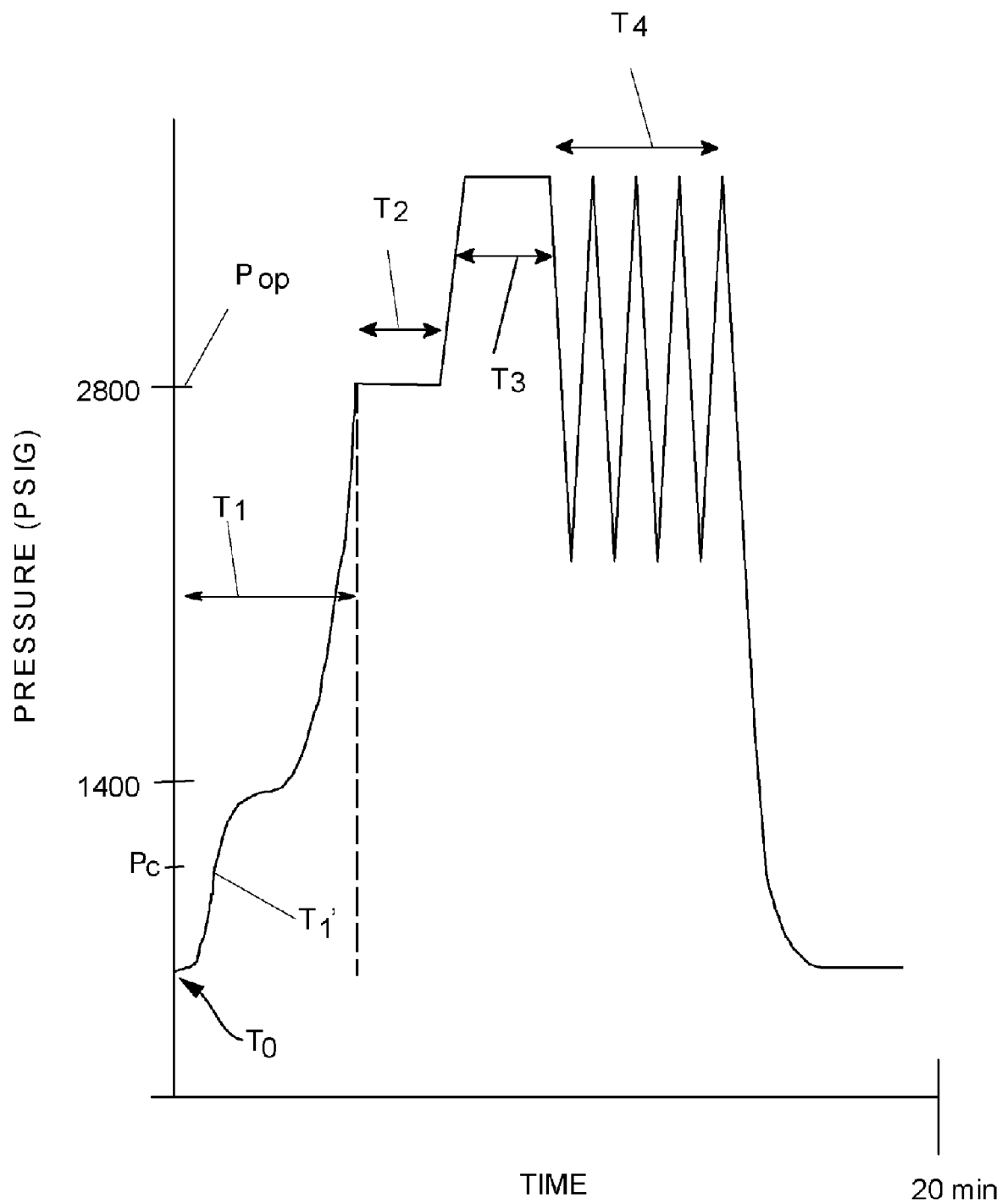
FIG. 4 is a plot of pressure versus time for supercritical carbon dioxide processing of a fluoro-carbon dielectric film in accordance with an embodiment of the invention.

FIG. 4 is a plot of pressure versus time for supercritical carbon dioxide processing in accordance with an embodiment of the invention. In FIG. 4, a substrate having a fluoro-carbon dielectric film deposited thereon, wherein the film has an exposed surface containing contaminants, is placed in a supercritical fluid process chamber at an initial time $T_0$. The process chamber can, for example, be process chamber 108 of the supercritical carbon dioxide processing system 100 in FIG. 3. During the time period $T_1$, the process chamber 108 is pressurized to generate a supercritical carbon dioxide fluid and to reach the desired operating pressure ($P_{op}$). When the carbon dioxide pressure within the process chamber 108 reaches or exceeds the critical pressure $P_c$ (1,070 psig for carbon dioxide at 31° C.) at time $T_1'$, one or more cleaning chemicals can be injected into the process chamber 108 from chemical supply system 130. The cleaning chemical can, for example, include an alcohol, a silicon-containing chemical, or both, as described above. Several injections of cleaning chemicals can be performed to generate a supercritical carbon dioxide fluid with the desired concentrations of cleaning chemicals. Alternately, the cleaning chemicals can be injected into the process chamber 108 after the time $T_1'$. In another embodiment of the invention, the supercritical fluid can contain pure carbon dioxide.

When the pressure within the process chamber 108 reaches an operating pressure $P_{op}$ at the start of time period $T_2$, the supercritical carbon dioxide fluid is circulated over and/or around the substrate 105 and through the process chamber 108 using the circulation system 120, such as described above. The operating pressure $P_{op}$ can be any value as long as the pressure is sufficient to maintain supercritical fluid conditions and can, for example, be about 2,800 psig. The length of the time period $T_2$ can be selected to sufficiently clean contaminants from the substrate 105.

Next, a push-through process can be carried out during time period $T_3$, where a fresh stock of supercritical carbon dioxide fluid is fed into the process chamber 108 from the carbon dioxide supply system 140, thereby increasing the pressure in the process chamber 108. Furthermore, during the push-through process in period $T_3$, the supercritical carbon dioxide fluid, along with any process residue suspended or dissolved therein, is simultaneously displaced from the process chamber 108 using the exhaust system 160.

The push-through process reduces the amount of particulates and contaminants that can fall-out from the supercritical carbon dioxide fluid when its composition is altered by adding the fresh stock of supercritical carbon dioxide fluid. A number of methods for reducing fall-out of particles and contaminants using push-through techniques and/or pressurization techniques are described in U.S. patent application Ser. No. 10/338,524, filed Jan. 7, 2003, titled "METHOD FOR REDUCING PARTICULATE CONTAMINATION IN SUPERCRITCIAL FLUID PROCESSING", and U.S. patent application Ser. No. 10/394,802, filed Mar. 21, 2003, titled "REMOVAL OF CONTAMINANTS USING SUPERCRITICAL PROCESSING", both of which are hereby incorporated by reference in their entirety.

When the push-through step is complete at the end of time period $T_3$, a plurality of decompression and compression cycles can be performed in the process chamber 108 during time period $T_4$ to further remove contaminants from the substrate 105 and the supercritical fluid processing system. The decompression and compression cycles can be performed using the exhaust system 160 to lower the process chamber pressure to below the operating pressure $P_{op}$ and then injecting fresh supercritical carbon dioxide fluid to raise the process chamber pressure to above the operating pressure $P_{op}$. The decompression and compression cycles allow the cleaning chemicals and any removed residue to be removed from the system before the next processing step. The supercritical cleaning steps are repeated as needed with the same or different cleaning chemicals. After a predetermined number of the decompression and compression cycles are completed (four cycles are shown in FIG. 4), the process chamber 108 can be vented and exhausted to atmospheric pressure through the exhaust system 160. Thereafter, the substrate 105 can be removed from the process chamber 108 by the substrate transfer system 170 and the next substrate loaded into the process chamber 108. Alternately, the processed substrate 105 can be exposed to a supercritical carbon dioxide rinsing solution in the process chamber 108 before the substrate is removed from the process chamber 108.

The graph shown in FIG. 4 is provided for exemplary purposes only. It will be understood by those skilled in the art that a supercritical processing step can have any number of different time/pressures or temperature profiles without departing from the scope of the present invention. Furthermore, any number of cleaning and rinse processing sequences with each step having any number of compression and decompression cycles are contemplated. In addition, as stated previously, concentrations of various chemicals and species within a supercritical carbon dioxide fluid can be readily tailored for the application at hand and altered at any time within a supercritical cleaning process.

Figure 5:
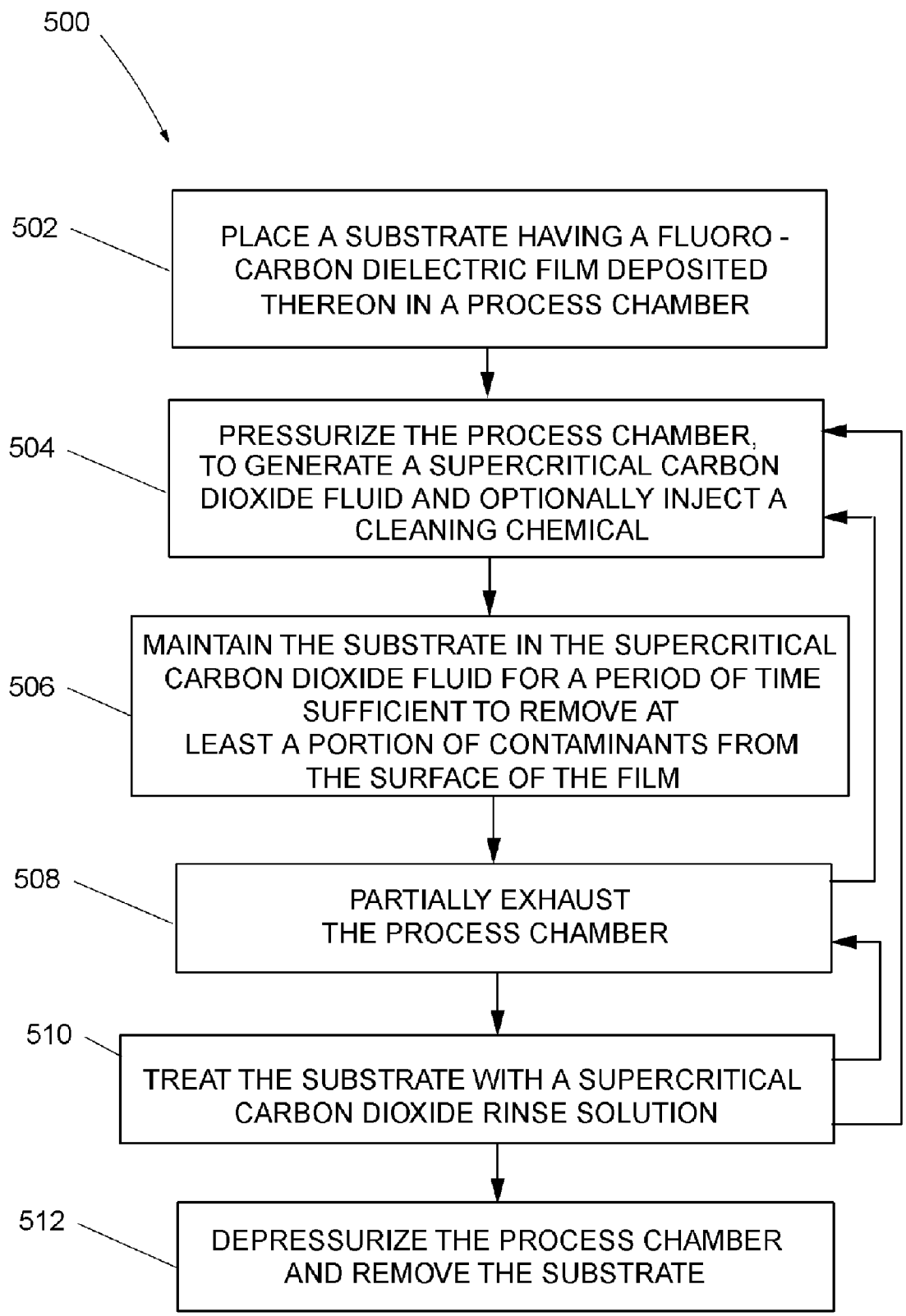
FIG. 5 is a flow diagram for supercritical carbon dioxide processing of a fluoro-carbon dielectric film in accordance with an embodiment of the invention.

FIG. 5 is a flow diagram for supercritical carbon dioxide processing of a fluoro-carbon dielectric film in accordance with an embodiment of the invention. The process 500 includes, in step 502, placing a substrate having a fluoro-carbon dielectric film deposited thereon in a process chamber, wherein the exposed surface of the fluoro-carbon dielectric film contains contaminants. After the substrate is placed in the process chamber, in step 504 carbon dioxide is added to the process chamber, which is then pressurized to generate supercritical carbon dioxide fluid, and a cleaning chemical is optionally added to the supercritical carbon dioxide fluid. Alternately, the cleaning chemical may be omitted from the supercritical carbon dioxide fluid. After the supercritical carbon dioxide fluid is generated in step 504, the substrate is maintained in the supercritical carbon dioxide fluid in step 506 for a period of time sufficient to remove at least a portion of the contaminants from the fluoro-carbon dielectric film. During the step 506, the supercritical carbon dioxide fluid can be circulated through the process chamber and/or otherwise agitated to move the supercritical carbon dioxide fluid over surfaces of the substrate.

Still referring to FIG. 5, after at least a portion of the contaminants is removed from fluoro-carbon dielectric film in step 506, the process chamber is partially exhausted at 508. The steps 504-508 can be repeated any number of times required to remove a portion of the contaminants from the fluoro-carbon dielectric film, as indicated in the flow diagram. In accordance with embodiments of the invention, repeating steps 504 and 506 can use fresh supercritical carbon dioxide, fresh chemicals, or both. Alternately, the concentration of the process chemicals in the supercritical carbon dioxide fluid can be modified by diluting the fluid with supercritical carbon dioxide, by adding additional charges of cleaning chemicals, or a combination thereof. In addition, each repeat of steps 504 and 506 may include changing the type of processing fluid, for example, changing from pure carbon dioxide fluid to carbon dioxide mixed with a cleaning chemical, or changing the type of cleaning chemical that is combined with the carbon dioxide, or eliminating the cleaning chemical to change to a pure carbon dioxide fluid. By way of example only, the fluoro-carbon dielectric film on the substrate may be cleaned first with a supercritical carbon dioxide fluid containing an alcohol, such as methanol, and then cleaned again with a supercritical carbon dioxide fluid containing a silicon-containing chemical, such as hexamethyidisilane. Alternately, the fluoro-carbon dielectric film on the substrate may be cleaned with a supercritical carbon dioxide fluid containing both an alcohol and a silicon-containing chemical.

Still referring to FIG. 5, after the cleaning process or cycles containing steps 504-508 is complete, the substrate can be treated with a supercritical carbon dioxide rinse solution in step 510. The supercritical carbon dioxide rinsing solution can contain supercritical carbon dioxide fluid and one or more organic solvents, for example an alcohol or a ketone, but can also be pure supercritical carbon dioxide. After the substrate is cleaned in the steps 504-508 and rinsed in the step 510, the process chamber is depressurized and the substrate is removed from the process chamber in step 512. Alternately, the substrate can be cycled through one or more additional cleaning/rinse processes comprising the steps 504-510, as indicated by the arrow connecting the steps 510 and 504 in the flow diagram. Alternately, or in addition to cycling the substrate through one or more additional cleaning/rinse cycles, the substrate can be treated to several rinse cycles prior to removing the substrate from the process chamber in step 512, as indicated by the arrow connecting the steps 510 and 508.

It will be clear to one skilled in the art of supercritical fluid processing that any number of different treatment sequences are within the scope of the invention. For example, cleaning steps and rinsing steps can be combined in any number of different ways to facilitate the removal of contaminants from a fluoro-carbon dielectric film. Furthermore, it would be appreciated by those skilled in the art, each of the steps or stages in the flowchart of FIG. 5 may encompass one or more separate steps and/or operations. Accordingly, the recitation of only seven steps in 502, 504, 506, 508, 510, 512 should not be understood to be limited solely to seven steps or stages. Moreover, each representative step or stage 502, 504, 506, 508, 510, 512 should not be understood to be limited to only a single process.

EXAMPLE

Supercritical Carbon Dioxide Processing of Fluoro-carbon Dielectric Films

A first batch of substrates included 200 mm Si wafers containing fluoro-carbon dielectric films on the Si wafers. A second batch of substrates contained 200 mm Si wafers containing nitrogen-incorporated fluoro-carbon dielectric films on the Si wafers. Reference will now be made to the pressure diagram in FIG. 4.

In a first supercritical carbon dioxide process flow, the above-mentioned first and second batches of substrates were processed for 2 min ($T_2$) at a process pressure ($P_{op}$) of 2,700 psig using a supercritical carbon dioxide fluid containing pure supercritical carbon dioxide. The processing further included three decompression-compression cycles ($T_4$) at pressures between 2,700 psig and 1,600 psig.

In a second supercritical carbon dioxide process flow, new first and second batches of substrates were processed for 2 min ($T_2$) at a process pressure ($P_{op}$) of 2,800 psig using a supercritical carbon dioxide fluid containing methanol (MeOH) solvent. The methanol solvent was injected at a process pressure of 2,300 psig. The processing further included a 2 min ($T_3$) push-through process at 2,950 psig, and five decompression-compression cycles ($T_4$) at pressures between 2,900 psig and 2,300 psig. Next, further processing was performed on the substrates for 2 min at a process pressure of 2,800 psig using a pure supercritical carbon dioxide fluid, followed by a 2 min push-through process at a pressure of 2,950 psig, and one decompression-compression cycle at pressures between 2,900 psig and 2,300 psig. Next, still further processing was performed for 2 min at a process pressure of 2,800 psig using a supercritical carbon dioxide fluid containing hexamethyidisilane (HMDS) solvent. The HMDS solvent was injected at a process pressure of 2,300 psig. The processing further included a 2 min push-through process at 2,950 psig, and five decompression-compression cycles at pressures between 2,900 psig and 2,300 psig.

Figure 6:
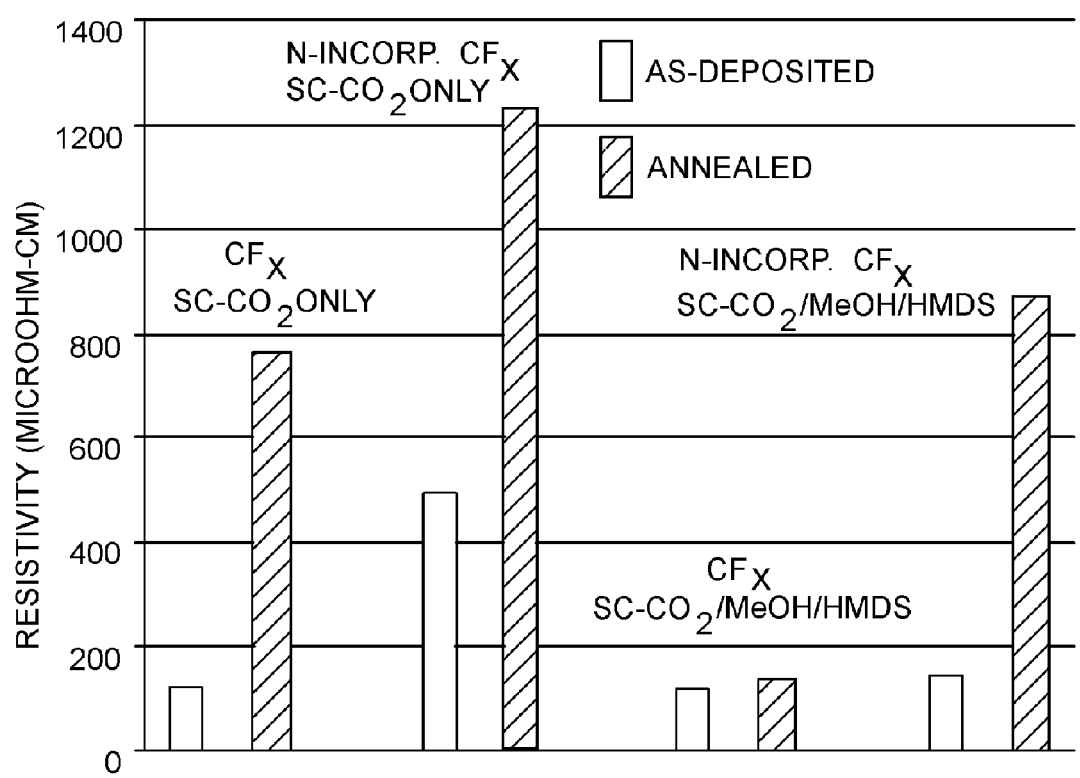
FIG. 6 shows electrical resistance measurements of film structures containing tantalum films deposited onto fluoro-carbon dielectric films processed according to embodiments of the present invention.

FIG. 6 shows electrical resistance measurements of film structures containing tantalum films deposited onto fluoro-carbon dielectric films processed according to embodiments of the present invention. The fluoro-carbon dielectric films were processed according to the above first and second process flow prior to deposition of the tantalum films onto the fluoro-carbon dielectric films. The tantalum films were deposited onto the fluoro-carbon dielectric films by physical vapor deposition at a substrate temperature of 250° C. and were about 200 Å thick. The electrical resistance measurements were performed before and after annealing the film structures in 2 Torr of Ar gas for 30 min at a substrate temperature of 400° C. The electrical resistance was measured in the center of the 200 mm wafers.

The electrical resistance measurements in FIG. 6 show that the electrical resistance of the film structures generally increased upon the annealing at 400° C. However, unexpectedly, the film structures containing fluoro-carbon dielectric layers that were processed using supercritical carbon dioxide fluids containing methanol and hexamethyidisilane, showed minimal increase in the measured electrical resistance upon annealing. It is believed that the supercritical carbon dioxide processing using methanol and hexamethyidisilane effectively cleans contaminants from the exposed surface of the fluoro-carbon dielectric film and forms a surface termination layer containing Si—$CH_3$ functional groups that reduces chemical reaction of the tantalum film with the fluoro-carbon dielectric film during the annealing at 400° C. Also, although not shown, processing with pure supercritical carbon dioxide fluid provided a significant improvement in electrical properties versus untreated film structures.

While the present invention has been described in terms of specific embodiments incorporating details to facilitate the understanding of the principles of construction and operation of the invention, such references herein to specific embodiments and details thereof are not intended to limit the scope of the claims appended hereto. It will be apparent to those skilled in the art that modifications may be made in the embodiments chosen for illustration without departing from the spirit and scope of the invention.

What is claimed is:

1. A method of processing a dielectric film, the method comprising:
providing a substrate having a fluoro-carbon dielectric film deposited thereon, the film having an exposed surface containing contaminants; and
treating the exposed surface with a supercritical carbon dioxide fluid to clean the exposed surface of the contaminants and provide surface termination,
wherein the supercritical carbon dioxide fluid further comprises a solvent, and
wherein the solvent comprises an alcohol or a silicon-containing chemical, or a combination thereof.

2. The method according to claim 1, wherein the contaminants comprise $CH_x$, $H_2O$, OH, or HF, or a combination of two or more thereof.

3. The method according to claim 1, wherein the alcohol comprises methanol, ethanol, propanol, or butanol, or a combination of two or more thereof.

4. The method according to claim 1, wherein the silicon-containing chemical comprises hexamethyldisilane, hexamethyldisilazane, dimethylsilyldiethylamine, tetramethyldisilazane, trimethylsilyldimethylamine, dimethylsilyldimethylamine, trimethylsilyldiethylamine, bis-trimethylsilyl-urea, bis(dimethylamino)methyl silane, bis(dimethylamino)dimethyl silane, dimethylaminopentamethyldisilane, or dimethylaminodimethyldisilane, or a combination of two or more thereof.

5. The method according to claim 1, wherein the surface termination comprises C—F functional groups or Si-$Me_3$ functional groups.

6. The method according to claim 1, wherein the treating comprises:
performing a first treatment wherein the supercritical carbon dioxide fluid contains the alcohol solvent; and
performing a second treatment wherein the supercritical carbon dioxide fluid contains a the silicon-containing chemical solvent.

7. The method according to claim 6, wherein the alcohol comprises methanol, ethanol, propanol, or butanol, or a combination of two or more thereof.

8. The method according to claim 6, wherein the silicon-containing chemical comprises hexamethyldisilane, hexamethyldisilazane, dimethylsilyldiethylamine, tetramethyldisilazane, trimethylsilyldimethylamine, dimethylsilyldimethylamine, trimethylsilyldiethylamine, bis-trimethylsilyl-urea, bis(dimethylamino)methyl silane, bis(dimethylamino)dimethyl silane, dimethylaminopentamethyldisilane, or dimethylaminodimethyldisilane, or a combination of two or more thereof.

9. The method according to claim 1, wherein the fluoro-carbon film comprises a nitrated fluoro-carbon film.

10. The method according to claim 1, further comprising:
depositing a metal-containing film onto the treated surface of the fluoro-carbon film, wherein the surface termination improves adhesion of the metal-containing film to the fluoro-carbon film.

11. The method according to claim 10, wherein the metal-containing film comprises tantalum.

12. A method of processing a dielectric film, the method comprising:
providing a substrate having a patterned fluoro-carbon dielectric film formed thereon, the patterned fluoro-carbon dielectric film having one or more vias or trenches, or a combination thereof, and the patterned fluoro-carbon dielectric film having an exposed surface containing contaminants; and treating the exposed surface with a supercritical carbon dioxide fluid and a solvent to clean the exposed surface of the contaminants and provide surface termination.

13. The method according to claim 12, wherein the contaminants comprise $CH_x$, $H_2O$, OH, or HF, or a combination of two or more thereof.

14. The method according to claim 12, wherein the solvent comprises an alcohol or a silicon-containing chemical, or a combination thereof.

15. The method according to claim 14, wherein the alcohol comprises methanol, ethanol, propanol, or butanol, or a combination of two or more thereof.

16. The method according to claim 14, wherein the silicon-containing chemical comprises hexamethyldisilane, hexamethyldisilazane, dimethylsilyldiethylamine, tetramethyldisilazane, trimethylsilyldimethylamine, dimethylsilyldimethylamine, trimethylsilyldiethylamine, bis-trimethylsilyl-urea, bis(dimethylamino)methyl silane, bis(dimethylamino)dimethyl silane, dimethylaminopentamethyldisilane, dimethylaminodimethyldisilane, or a combination of two or more thereof.

17. The method according to claim 12, wherein the surface termination comprises C—F functional groups or Si-Me$_3$ functional groups.

18. The method according to claim 12, wherein the treating comprises:
performing a first treatment wherein the supercritical carbon dioxide fluid contains an alcohol as the solvent; and
performing a second treatment wherein the supercritical carbon dioxide fluid contains a silicon-containing chemical as the solvent.

19. The method according to claim 18, wherein the alcohol comprises methanol, ethanol, propanol, or butanol, or a combination of two or more thereof.

20. The method according to claim 18, wherein the silicon-containing chemical comprises hexamethyldisilane, hexamethyldisilazane, dimethylsilyldiethylamine, tetramethyldisilazane, trimethylsilyldimethylamine, dimethylsilyldimethylamine, trimethylsilyldiethylamine, bis-trimethylsilyl-urea, bis(dimethylamino)methyl silane, bis(dimethylamino)dimethyl silane, dimethylaminopentamethyldisilane, or dimethylaminodimethyldisilane, or a combination of two or more thereof.

21. The method according to claim 12, wherein the fluoro-carbon film comprises a nitrated fluoro-carbon film.

22. The method according to claim 12, further comprising:
depositing a metal-containing film onto the treated surface of the fluoro-carbon film, wherein the surface termination improves adhesion of the metal-containing film to the fluoro-carbon film.

23. The method according to claim 22, wherein the metal-containing film comprises tantalum.

* * * * *

UNITED STATES PATENT AND TRADEMARK OFFICE
CERTIFICATE OF CORRECTION

PATENT NO. : 7,307,019 B2
APPLICATION NO. : 10/711649
DATED : December 11, 2007
INVENTOR(S) : Kawamura et al.

It is certified that error appears in the above-identified patent and that said Letters Patent is hereby corrected as shown below:

Col. 1, line 23, "which in turn, increases" should read --which in turn increases--.

Col. 2, line 61, "incorporation, for example," should read --incorporation can, for example,--.

Col. 4, line 66, "coupled to a one or more" should read --coupled to one or more--.

Col. 10, line 15, "hexamethyidisilane" should read --hexamethyldisilane--.

Col. 10, line 47, "only seven steps" should read --only six steps--.

Col. 11, line 20, "hexamethyidisilane" should read --hexamethyldisilane--.

Col. 11, line 45, "hexamethyidisilane" should read --hexamethyldisilane--.

Col. 11, lines 48 and 49, "hexamethyidisilane" should read --hexamethyldisilane--.

Col. 12, line 37, "contains a the silicon-containing" should read --contains the silicon-containing--.

Signed and Sealed this

Twenty-eighth Day of October, 2008

JON W. DUDAS
*Director of the United States Patent and Trademark Office*